(12) United States Patent
Wang et al.

(10) Patent No.: US 10,885,847 B2
(45) Date of Patent: Jan. 5, 2021

(54) ORGANIC LIGHT EMITTING DIODE DISPLAY

(71) Applicant: Samsung Display Co., Ltd., Yongin-si (KR)

(72) Inventors: Seong Min Wang, Seongnam-si (KR); Yong Ho Yang, Suwon-si (KR); Sung Ho Kim, Suwon-si (KR); Young-In Hwang, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/269,858

(22) Filed: Feb. 7, 2019

(65) Prior Publication Data
US 2019/0304373 A1 Oct. 3, 2019

(30) Foreign Application Priority Data

Apr. 3, 2018 (KR) ........................ 10-2018-0038782

(51) Int. Cl.
*G09G 3/32* (2016.01)
*G09G 3/3258* (2016.01)
(Continued)

(52) U.S. Cl.
CPC ....... *G09G 3/3258* (2013.01); *H01L 27/3262* (2013.01); *H01L 27/3265* (2013.01);
(Continued)

(58) Field of Classification Search
CPC ............ H01L 27/3265; H01L 27/3276; H01L 27/3262; H01L 27/124; H01L 27/3248; G09G 3/3233
See application file for complete search history.

(56) References Cited

U.S. PATENT DOCUMENTS 9,276,050 B2* 3/2016 Kwon ................. H01L 27/3262
9,502,488 B2* 11/2016 Hwang ............... H01L 27/1222
(Continued)

FOREIGN PATENT DOCUMENTS

KR 10-2017-0014087 A 2/2017
KR 10-2017-0124679 A 11/2017
KR 10-2017-0127602 A 11/2017

*Primary Examiner* — Eva Y Montalvo
*Assistant Examiner* — David J Goodwin
(74) *Attorney, Agent, or Firm* — Kile Park Reed & Houtteman PLLC

(57) ABSTRACT

An organic light emitting diode display includes a flexible substrate, a semiconductor layer on the flexible substrate, and an overlapping layer. The transistor includes a driving transistor, a second transistor to transmit a data voltage transmitted through the data line to an input electrode of the driving transistor, and a third transistor including a gate electrode connected to the scan line, a first electrode connected to an output electrode of the driving transistor, and a second electrode connected to a gate electrode of the driving transistor. The third transistor includes two transistors connected in series to each other and connected to each other at a third node, the third node is formed in the semiconductor layer, an additional capacitance portion is formed in the semiconductor layer in the vicinity of the third node, and the overlapping layer overlaps the third node and the capacitance portion of the semiconductor layer.

29 Claims, 23 Drawing Sheets

(51) Int. Cl.
*G09G 3/20* (2006.01)
*H01L 27/32* (2006.01)
*H01L 51/00* (2006.01)

(52) U.S. Cl.
CPC ...... *H01L 27/3272* (2013.01); *H01L 27/3276* (2013.01); *H01L 51/0097* (2013.01); *G09G 2300/0809* (2013.01); *G09G 2320/0219* (2013.01); *H01L 2251/5338* (2013.01)

(56) References Cited

U.S. PATENT DOCUMENTS

| | | | |
|---|---|---|---|
| 2014/0034923 A1* | 2/2014 | Kim | H01L 27/3265 257/40 |
| 2016/0104758 A1* | 4/2016 | Kim | H01L 28/60 257/40 |
| 2016/0133190 A1* | 5/2016 | Kim | G09G 3/2011 345/80 |
| 2016/0321996 A1* | 11/2016 | Lee | H01L 27/3248 |
| 2017/0117343 A1 | 4/2017 | Oh et al. | |
| 2017/0194406 A1* | 7/2017 | Choi | H01L 27/3262 |

\* cited by examiner

ORGANIC LIGHT EMITTING DIODE DISPLAY

CROSS-REFERENCE TO RELATED APPLICATION

Korean Patent Application No. 10-2018-0038782 filed on Apr. 3, 2018, in the Korean Intellectual Property Office, and entitled: "Organic Light Emitting Diode Display," is incorporated by reference herein in its entirety.

BACKGROUND

1. Field

Embodiments relate to an organic light emitting diode (OLED) display.

2. Description of the Related Art

Display devices display images, and the organic light emitting diode display among them, have been in the spotlight.

The organic light emitting diode display has a self-luminance characteristic and does not require a separate light source, unlike a liquid crystal display (LCD) device, and thus may have reduced thickness and weight. Further, the organic light emitting diode display may provide high quality characteristics of low power consumption, high luminance, and a high reaction speed.

The above information disclosed in this Background section is only for enhancement of understanding of the background and therefore it may contain information that does not form the prior art that is already known in this country to a person of ordinary skill in the art.

SUMMARY

Embodiments are directed to an organic light emitting diode display, including a flexible substrate, a semiconductor layer on the flexible substrate, the semiconductor layer including a channel, a first electrode, and a second electrode of a transistor, and an overlapping layer. The transistor may includes a driving transistor configured to apply a current to an organic light emitting element, a second transistor that is connected to a scan line and a data line, the second transistor to transmit a data voltage transmitted through the data line to an input electrode of the driving transistor, and a third transistor including a gate electrode connected to the scan line, a first electrode connected to an output electrode of the driving transistor, and a second electrode connected to a gate electrode of the driving transistor. The third transistor may include two transistors connected in series to each other and connected to each other at a third node, the third node may be formed in the semiconductor layer, an additional capacitance portion may be formed in the semiconductor layer in the vicinity of the third node, and the overlapping layer may overlap the third node and the capacitance portion of the semiconductor layer.

The semiconductor layer may extend in a first direction within the third transistor, may be bent in a second direction, and may then extend in the second direction.

The third node may be disposed at a bent portion of the semiconductor layer.

The capacitance portion may be a portion of the semiconductor layer protruding in an upper direction at the bent portion.

The capacitance portion may be a portion of the semiconductor layer protruding in the first direction at the bent portion.

The capacitance portion may be a portion of the semiconductor layer protruding in the first and upper directions at the bent portion.

The capacitance portion may be spaced apart from the semiconductor layer by a predetermined distance at the bent portion.

The overlapping layer may be disposed between the flexible substrate and the semiconductor layer in a cross-sectional view.

The overlapping layer may be floated.

The overlapping layer may be applied with a driving voltage ELVDD.

The organic light emitting diode display may further include a barrier layer above the flexible substrate and below the overlapping layer, a buffer layer above the overlapping layer and below the semiconductor layer, a first gate insulating layer covering the semiconductor layer, a first gate conductor on the first gate insulating layer, a second gate insulating layer covering the first gate conductor and the first gate insulating layer, a second gate conductor on the second gate insulating layer, an interlayer insulating layer covering the second gate conductor and the second gate insulating layer, a data conductor on the interlayer insulating layer, and a passivation layer covering the data conductor and the interlayer insulating layer. The data conductor may include a driving voltage line applying the driving voltage ELVDD, the driving voltage line and the second gate conductor may be electrically connected to each other through an opening in the interlayer insulating layer, and the second gate conductor may be electrically connected to the overlapping layer through an opening in the buffer layer, the first gate insulating layer, and the second gate insulating layer.

The second gate conductor may be a parasitic capacitor control pattern.

The second gate conductor may be a connecting member.

The overlapping layer may be disposed above the semiconductor layer in a cross-sectional view.

The organic light emitting diode display may further include a barrier layer above the flexible substrate and below the overlapping layer, a buffer layer above the overlapping layer and below the semiconductor layer, a first gate insulating layer covering the semiconductor layer, a first gate conductor on the first gate insulating layer, a second gate insulating layer covering the first gate conductor and the first gate insulating layer, a second gate conductor on the second gate insulating layer, an interlayer insulating layer covering the second gate conductor and the second gate insulating layer, a data conductor on the interlayer insulating layer, and a passivation layer covering the data conductor and the interlayer insulating layer. The overlapping layer may be on the same layer as the gate conductor.

The data conductor may include a driving voltage line applying the driving voltage ELVDD, and the driving voltage line and the overlapping layer may be electrically connected to each other through an opening in the interlayer insulating layer.

The overlapping layer may be integrally formed with the parasitic capacitor control pattern.

Embodiments are also directed to an organic light emitting diode display, including a flexible substrate, a semiconductor layer on the flexible substrate, the semiconductor layer including a channel, a first electrode, and a second electrode of a transistor, an overlapping layer between the semiconductor layer and the flexible substrate, and a parasitic capacitor control pattern disposed higher than the semiconductor layer from the flexible substrate. The transistor may includes a driving transistor configured to apply a current to an organic light emitting element, a second transistor that is connected to a scan line and a data line, the second transistor to transmit a data voltage transmitted through the data line to an input electrode of the driving transistor, and a third transistor including a gate electrode connected to the scan line, a first electrode connected to an output electrode of the driving transistor, and a second electrode connected to a gate electrode of the driving transistor. The third transistor may include two transistors connected in series to each other and connected to each other at a third node, the third node may be formed in the semiconductor layer, and the overlapping layer, the parasitic capacitor control pattern, and the third node of the semiconductor layer may be sequentially overlapped.

The parasitic capacitor control pattern may be applied with a driving voltage ELVDD.

An additional capacitance portion may be formed in the semiconductor layer in the vicinity of the third node, and the overlapping layer may overlap the third node and the capacitance portion of the semiconductor layer.

BRIEF DESCRIPTION OF THE DRAWINGS

Features will become apparent to those of skill in the art by describing in detail example embodiments with reference to the attached drawings in which.

DETAILED DESCRIPTION

Figure 1:
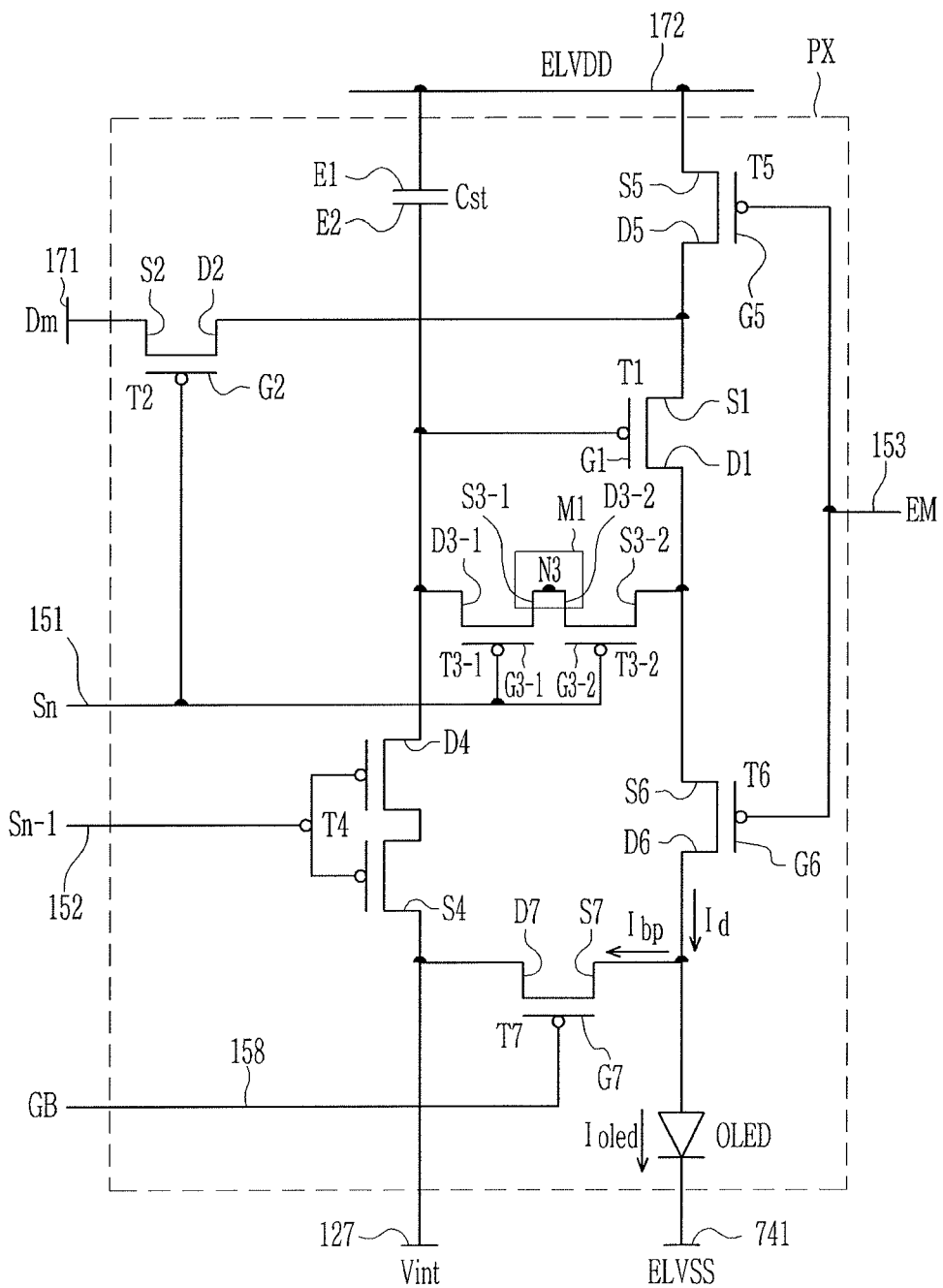
FIG. 1 illustrates an equivalent circuit diagram of one pixel of an organic light emitting diode display according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. Like reference numerals refer to like elements throughout.

Parts that are irrelevant to the description may be omitted to clearly describe the present disclosure.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

Hereinafter, an organic light emitting diode display according to an example embodiment will be described with reference to FIG. 1 and FIG. 2.

Figure 2:
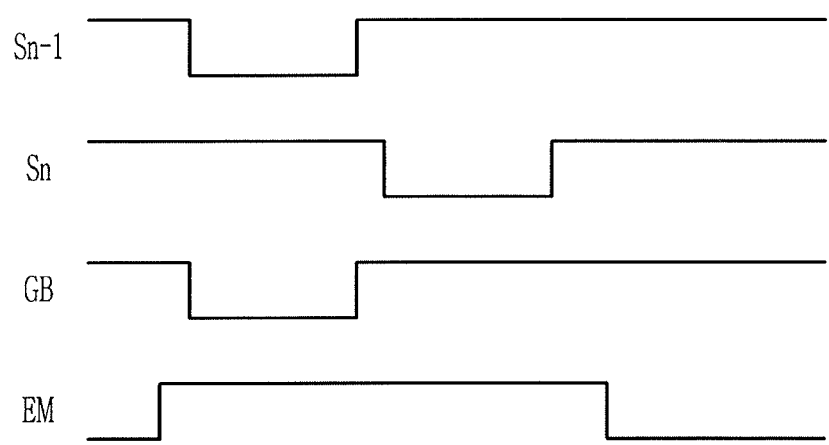
FIG. 2 illustrates a timing chart of a signal applied to one pixel of an organic light emitting diode display according to an example embodiment.

FIG. 1 illustrates an equivalent circuit diagram of one pixel of an organic light emitting diode display according to an example embodiment, and FIG. 2 illustrates a timing chart of a signal applied to one pixel of an organic light emitting diode display according to an example embodiment.

According to the present example embodiment, referring to FIG. 1, a pixel PX of an organic light emitting diode display includes a plurality of transistors T1, T2, T3, T4, T5, T6, and T7 connected to several signal lines 127, 151, 152, 153, 158, 171, 172, and 741, a storage capacitor Cst, and an organic light emitting diode OLED.

Each of the third transistor T3 and the fourth transistor T4 is shown as a structure including two transistors connected in series to each other. The structure including two transistors connected in series to each other means a structure in which gate electrodes of two transistors T3-1 and T3-2 are connected to each other to receive the same signal, and an output signal of one transistor is applied to the other transistor as an input signal.

According to the present example embodiment, the third transistor T3 is formed to have a structure in which a 3-1 transistor T3-1 and a 3-2 transistor T3-2 are connected in series to each other. A gate electrode G3-1 of the 3-1 transistor T3-1 and a gate electrode G3-2 of the 3-2 transistor T3-2 are connected to each other, and a first electrode S3-1 of the 3-1 transistor T3-1 and a second electrode D3-2 of the 3-2 transistor T3-2 are also connected to each other. The fourth transistor T4 is also formed to have a structure in which two transistors are connected in series to each other, but in some example embodiments, it may be fin ied as a single transistor.

In addition, an overlapping layer M1 is further included in a pixel shown in FIG. 1 as one example. The overlapping layer M1 overlaps a node N3 (hereinafter referred to as a 'third node'), and the first electrode S3-1 of the 3-1 transistor T3-1 of the third transistor T3 and the second electrode D3-2 of the 3-2 transistor T3-2 of the third transistor T3 are connected to each other.

The overlapping layer M1 may be disposed above or below the third node overlapping a substrate with respect to the substrate.

According to the present example embodiment, a separate voltage may not be applied to the overlapping layer M1. Thus, the overlapping layer M1 may be in a floating state. In another example embodiment, the overlapping layer M1 may be electrically connected to another portion to receive a voltage, and the voltage that may be applied thereto may vary. The overlapping layer M1 to which the voltage is applied will be described below with reference to FIG. 13.

According to the present example embodiment, an additional capacitance is formed between the third node N3 and the overlapping layer M1, and the additional capacitance serves to buffer a voltage change at the third node N3.

According to the present example embodiment, the plurality of transistors T1, T2, T3, T4, 15, T6, and T7 include a driving transistor T1, a second transistor T2 and a third transistor T3 as switching transistors connected to a scan line 151, and the remaining transistors T4, T5, T6, and T7 (hereinafter referred to as compensation transistors) for operating the organic light emitting diode OLED. The compensation transistors T4, T5, T6, and T7 may include a fourth transistor T4, a fifth transistor T5, a sixth transistor T6, and a seventh transistor T7.

The plurality of signal lines (127, 151, 152, 153, 158, 171, 172, and 741) may include the scan line 151, a front scan line 152, a light emission control line 153, a bypass control line 158, a data line 171, a driving voltage line 172, an initialization voltage line 127, and a common voltage line 741. The bypass control line 158 may be a portion of the front scan line 152 or may be electrically connected thereto.

According to the present example embodiment, the scan line 151 is connected to a gate driver to transmit a scan signal Sn to switching transistors, that is, to the second transistor T2 and the third transistor T3. The front scan line 152 is connected to the gate driver to transmit a front scan signal Sn−1 applied to a pixel PX disposed at a front side thereof to the fourth transistor T4. The fourth transistor T4 may include two transistors connected in series to each other. Thus, the front scan signal Sn−1 may be applied to a gate electrode of each of the two transistors connected in series to each other included in the fourth transistor T4. The light emission control line 153 is connected to a light emission controller, and transmits a light emission control signal EM for controlling a time at which the organic light emitting diode OLED emits light to the fifth transistor T5 and the sixth transistor T6. The bypass control line 158 transmits a bypass signal GB to the seventh transistor T7, and in some example embodiments, it may transmit the same signal as the front scan signal Sn−1 thereto.

According to the present example embodiment, the data line 171 is a wire for transmitting a data voltage Dm generated by a data driver, and light emission luminance of an organic light emitting diode (OLED; also called an 'organic light emitting element') varies according to the data voltage Dm. The driving voltage line 172 applies a driving voltage ELVDD, the initialization voltage line 127 transmits an initialization voltage Vint for initializing the driving transistor T1, and the common voltage line 741 applies a common voltage ELVSS. A constant voltage may be applied to each of the driving voltage line 172, the initialization voltage line 127, and the common voltage line 741.

Hereinafter, the plurality of transistors will be described.

According to the present example embodiment, the driving transistor T1 is a transistor that adjusts a current output according to the applied data voltage Dm, and an output driving current Id is applied to the organic light emitting diode OLED. Thus, brightness of the organic light emitting diode OLED is adjusted according to the data voltage Dm. In an implementation, a first electrode S1 of the driving transistor T1 is disposed to be able to receive the driving voltage ELVDD, and is connected to the driving voltage line 172 via the fifth transistor T5. In the present example embodiment, the first electrode S1 of the driving transistor T1 is connected to a second electrode D2 of the second transistor T2 to receive the data voltage Dm. A second electrode D1 (output side electrode) is disposed to be able to output a current to the organic light emitting diode OLED, and is connected to an anode of the organic light emitting diode OLED via the sixth transistor T6. A gate electrode G1 is connected to one electrode (a second storage electrode E2) of the storage capacitor Cst. Thus, a voltage of the gate electrode G1 is changed according to a voltage stored in the storage capacitor Cst, so that the driving current Id output from the driving transistor T1 is changed.

According to the present example embodiment, the second transistor T2 is a transistor for transmitting the data voltage Dm to the pixel PX. A gate electrode G2 is connected to the scan line 151, and a first electrode S2 is connected to the data line 171. The second electrode D2 of the second transistor T2 is connected to the first electrode S1 of the driving transistor T1. When the second transistor T2 is turned on according to the scan signal Sn transmitted through the scan line 151, the data voltage Dm transmitted through the data line 171 is transmitted to the first electrode S1 of the driving transistor T1.

According to the present example embodiment, the third transistor T3 is a transistor for transmitting a compensation voltage (a voltage of Dm+Vth), which is changed while the data voltage Dm passes through the driving transistor T1, to the second storage electrode E2 of the storage capacitor Cst. The third transistor T3 includes the 3-1 transistor T3-1 and the 3-2 transistor T3-2 connected in series to each other. The gate electrodes G3-1 and G3-2 of the transistors T3-1 and T3-2 are connected to the scan line 151. A first electrode S3-2 of the 3-2 transistor T3-2 is connected to the second electrode D1 of the driving transistor T1, and a second electrode D3-1 of the 3-1 transistor T3-1 is connected to the second storage electrode E2 of the storage capacitor Cst and the gate electrode G1 of the driving transistor T1. In the present example embodiment, the first electrode S3-1 of the 3-1 transistor T3-1 and the second electrode D3-2 of the 3-2 transistor T3-2 are connected to each other at the third node N3. When the third transistor T3 is described as one transistor, the first electrode S3-2 of the 3-2 transistor T3-2 is a first electrode of the third transistor T3, and the second electrode D3-1 of the 3-1 transistor T3-1 is a second electrode of the third transistor T3. The third transistor T3 is turned on in response to the scan signal Sn received through the scan line 151 to connect the gate electrode G1 and the second electrode D1 of the driving transistor T1 and to connect the second electrode D1 of the driving transistor T1 and the second storage electrode E2 of the storage capacitor Cst.

According to the present example embodiment, the fourth transistor T4 serves to initialize the gate electrode G1 of the driving transistor T1 and the second storage electrode E2 of the storage capacitor Cst. A gate electrode G4 is connected to the front scan line 152, and a first electrode S4 is connected to the initialization voltage line 127. A second electrode D4 of the fourth transistor T4 is connected to the second storage electrode E2 of the storage capacitor Cst and the gate electrode G1 of the driving transistor T1 via the second electrode D3 of the third transistor T3. The fourth transistor T4 also includes two transistors connected in series to each other. The fourth transistor T4 transmits the initialization voltage Vint to the gate electrode G1 of the driving transistor T1 and the second storage electrode E2 of the storage capacitor Cst according to the front scan signal Sn–1 received through the front scan line 152. Thus, a gate voltage of the gate electrode G1 of the driving transistor T1 and the storage capacitor Cst are initialized. The initialization voltage Vint may be a low voltage that may turn on the driving transistor T1.

According to the present example embodiment, the fifth transistor T5 serves to transmit the driving voltage ELVDD to the driving transistor T1. A gate electrode G5 is connected to the light emission control line 153, and a first electrode S5 is connected to the driving voltage line 172. A second electrode D5 of the fifth transistor T5 is connected to the first electrode S1 of the driving transistor T1.

According to the present example embodiment, the sixth transistor T6 serves to transmit the driving current Id output from the driving transistor T1 to the organic light emitting diode OLED. A gate electrode G6 is connected to the light emission control line 153, and a first electrode S6 is connected to the second electrode D1 of the driving transistor T1. A second electrode D6 of the sixth transistor T6 is connected to the anode of the organic light emitting diode OLED.

According to the present example embodiment, the fifth transistor T5 and the sixth transistor T6 are simultaneously turned on by the light emission control signal EM received through the light emission control line 153, and when the driving voltage ELVDD is applied to the first electrode S1 of the driving transistor T1 through the fifth transistor T5, the driving transistor T1 outputs the driving current Id according to a voltage (i.e., a voltage of the second electrode E2 of the storage capacitor Cst) of the gate electrode G1 of the driving transistor T1. The output driving current Id is transmitted to the organic light emitting diode OLED through the sixth transistor T6. The organic light emitting diode OLED emits light as a current (bled) flows therethrough.

According to the present example embodiment, the seventh transistor T7 serves to initialize the anode of the organic light emitting diode OLED. A gate electrode G7 is connected to the bypass control line 158, a first electrode S7 is connected to the anode of the organic light emitting diode OLED, and a second electrode D7 is connected to the initialization voltage line 127. The bypass control line 158 may be connected to the front scan line 152, and the bypass signal GB is the same timing signal as the front scan signal Sn–1. The bypass control line 158 may not be connected to the front scan line 152, and may transmit a separate signal different from the front scan signal Sn–1. When the seventh transistor T7 is turned on by the bypass signal GB, the initialization voltage Vint is applied to the anode of the organic light emitting diode OLED to initialize it.

According to the present example embodiment, a first storage electrode E1 of the storage capacitor Cst is connected to the driving voltage line 172, and the second storage electrode E2 is connected to the gate electrode G1 of the driving transistor T1, the second electrode D3 of the third transistor T3, and the second electrode D4 of the fourth transistor T4. Thus, the second storage electrode E2 may determine the voltage of the gate electrode G1 of the driving transistor T1, and may receive the data voltage Dm through the second electrode D3 of the third transistor T3, or the initialization voltage Vint through the second electrode D4 of the fourth transistor T4.

In the present example embodiment of FIG. 1, an additional storage capacitor is formed by the third node N3 and the overlapping layer M1 in the third transistor T3. Thus, the signal change at the third node N3 may be reduced, thereby improving characteristics of the third transistor T3 as a whole.

According to the present example embodiment, the anode of the organic light emitting diode OLED is connected to the second electrode D6 of the sixth transistor T6 and the first electrode S7 of the seventh transistor T7, and the cathode thereof is connected to the common voltage line 741 for transmitting the common voltage ELVSS.

In the present example embodiment of FIG. 1, the pixel circuit includes seven transistors (T1-T7) and one capacitor Cst, but a number of transistors and a number of capacitors and connection therebetween may be variously changed.

The organic light emitting diode display may include a display area in which an image is displayed, and the pixels PX may be arrayed in various forms such as a matrix in the display area.

An operation of one pixel of the organic light emitting diode display according to an example embodiment will now be described with reference to FIG. 1 and FIG. 2.

During an initialization period, the front scan signal Sn–1 of a low level is supplied to the pixel PX through the front scan line 152. The fourth transistor T4 to which the front scan signal Sn–1 of the low level is applied increases in conductivity, so that the initialization voltage Vint is applied to the gate electrode G1 of the driving transistor T1 and the second storage electrode E2 of the storage capacitor Cst through the fourth transistor T4. Accordingly, the driving transistor T1 and the storage capacitor Cst are initialized. A voltage of the initialization voltage Vint is low such that the driving transistor T1 may be turned on.

In addition, during the initialization period, the bypass signal GB of a low level is applied to the seventh transistor T7. The seventh transistor T7 to which the bypass signal GB of the low level is applied is turned on, so that the initialization voltage Vint is applied to the anode of the organic light emitting diode OLED through the seventh transistor T7. Accordingly, the anode of the organic light emitting diode OLED is also initialized.

Thereafter, during a data writing period, the scan signal Sn of a low level is supplied to the pixel PX through the scan line 151. The second transistor T2 and the third transistor T3 are turned on by the scan signal Sn of the low level.

When the second transistor T2 is turned on, the data voltage Dm is inputted to the first electrode S1 of the driving transistor T1 through the second transistor T2.

In addition, during the data writing period, the third transistor T3 is turned on, so that the second electrode D2 of the driving transistor T1 is electrically connected to the gate electrode G1 and the second storage electrode E2 of the storage capacitor Cst. The gate electrode G1 of the driving transistor T1 and the second electrode D2 are diode-connected. Further, the low voltage (the initialization voltage Vint) is applied to the gate electrode G1 during the initialization period. Thus, the driving transistor T1 is in a turned-on state. Accordingly, the data voltage Dm inputted to the first electrode S1 of the driving transistor T1 is output from the second electrode D1 through a channel of the driving transistor T1, and then is stored in the second storage electrode E2 of the storage capacitor Cst through the third transistor T3.

The voltage applied to the second storage electrode E2 is changed according to a threshold voltage Vth of the driving transistor T1, the data voltage Dm is applied to the first electrode S1 of the driving transistor T1, and when the initialization voltage Vint is applied to the gate electrode G1 of the driving transistor T1, a voltage output in the second electrode D1 may be 'Vgs+Vth'. Here, the Vgs is a difference between voltages applied to the gate electrode G1 and the first electrode S1 of the driving transistor T1, thus it may be 'Dm−Vint'. Therefore, the voltage that is output from the second electrode D1 and stored in the second storage electrode E2 may be 'Dm−Vint+Vth'.

A kickback voltage of the third transistor T3 increases in a case in which the third transistor T3 is formed on a flexible substrate compared to a case in which the third transistor T3 is formed on a rigid substrate such as glass. An increase of the kickback voltage is prominent when black is displayed, and a gray afterimage is left when white and black are alternately displayed. When the white and black are alternately displayed like a checkerboard or chessboard pattern, the gray afterimage is left, which is referred to as a chess afterimage. This may be avoided by reducing the kickback voltage of the third transistor T3. In the present example embodiment, an additional storage capacitor connected to the third transistor T3 is formed, and thus the overlapping layer M1 overlapping the third node N3 is included.

During a light emission period, the light emission control signal EM supplied from the light emission control line 153 is a low level, and the fifth transistor T5 and the sixth transistor T6 are turned on. Accordingly, the driving voltage ELVDD is applied to the first electrode S1 of the driving transistor T1, and the second electrode D1 of the driving transistor T1 is connected to the organic light emitting diode OLED. The driving transistor T1 outputs the driving current Id according to a difference between the voltage of the gate electrode G1 and the voltage (i.e., the driving voltage ELVDD) of the first electrode S1. The driving current Id of the driving transistor T1 may have a value proportional to a squared value of 'Vgs−Vth'. Here, the Vgs is a difference between voltages applied to both terminals of the storage capacitor Cst, and since the Vgs is 'Vg−Vs', it may be 'Dm−Vint+Vth−ELVDD'. Here, when 'Vgh−Vth' is obtained by subtracting Vth, it is 'Dm−Vint−ELVDD'. Thus, the driving current Id of the driving transistor T1 may be a current which is independent of a threshold voltage Vth of the driving transistor T1.

As described above, an example embodiment may output an output current of the driving transistor T1 to be constant even though the driving transistors T1 disposed in respective pixels PX have different threshold voltages Vth due to process dispersion, thereby improving non-uniformity of the characteristics thereof.

In the above calculation formulas, when the transistor is a p-type transistor using a polycrystalline semiconductor, the Vth may be a value that is slightly larger than 0 or a negative value. In addition, signs of + and − may be changed depending on a direction in which the voltage is calculated. However, even in this case, the driving current Id which is an output current of the driving transistor T1 may have a value independent of the threshold voltage Vth.

When the above-described light emission period ends, the same operation may be repeated from the initialization period.

One of the first electrode and the second electrode of each of the plurality of transistors T1, T2, T3, T4, T5, T6, and T7 may be a source electrode and the other thereof may be a drain electrode, depending on a direction in which a voltage or current is applied.

In an example embodiment, while the seventh transistor T7 initializes the anode of the organic light emitting diode OLED in the initialization period, it may prevent even a small amount of current emitted under a condition in which the driving transistor T1 is not actually turned on from flowing toward the organic light emitting diode OLED by the small amount of current being discharged through the seventh transistor T7 to a terminal of the initialization voltage Vint stage as a bypass current Ibp. Accordingly, the organic light emitting diode OLED may be prevented from emitting unwanted light, so that a black gradation may be displayed more clearly and a contrast ratio may be improved. The bypass signal GB may be a signal having different timing from that of the front scan signal Sn−1. In an example embodiment, the seventh transistor T7 may be omitted.

In the pixel PX operating as described above, the overlapping layer M1 may not operate and may remain in a floating state. However, an additional storage capacitor is formed between the third transistor T3 and the third node N3 by the overlapping layer M1 to stabilize a voltage variation at the third node N3. Thus, it may be possible to prevent an afterimage from remaining. In the present example embodiment, the overlapping layer M1 overlaps the third transistor T3 and is disposed between the substrate and the third transistor T3. Thus, the third transistor T3 may have a desired characteristic by preventing impurities from coming from the flexible substrate made of plastic or polyimide (PI) when the third transistor T3 is manufactured.

Hereinafter, a disposition of the pixel and the overlapping layer M1 of the organic light emitting diode display according to an example embodiment will be described with reference to FIG. 3 to FIG. 5.

Figure 3:
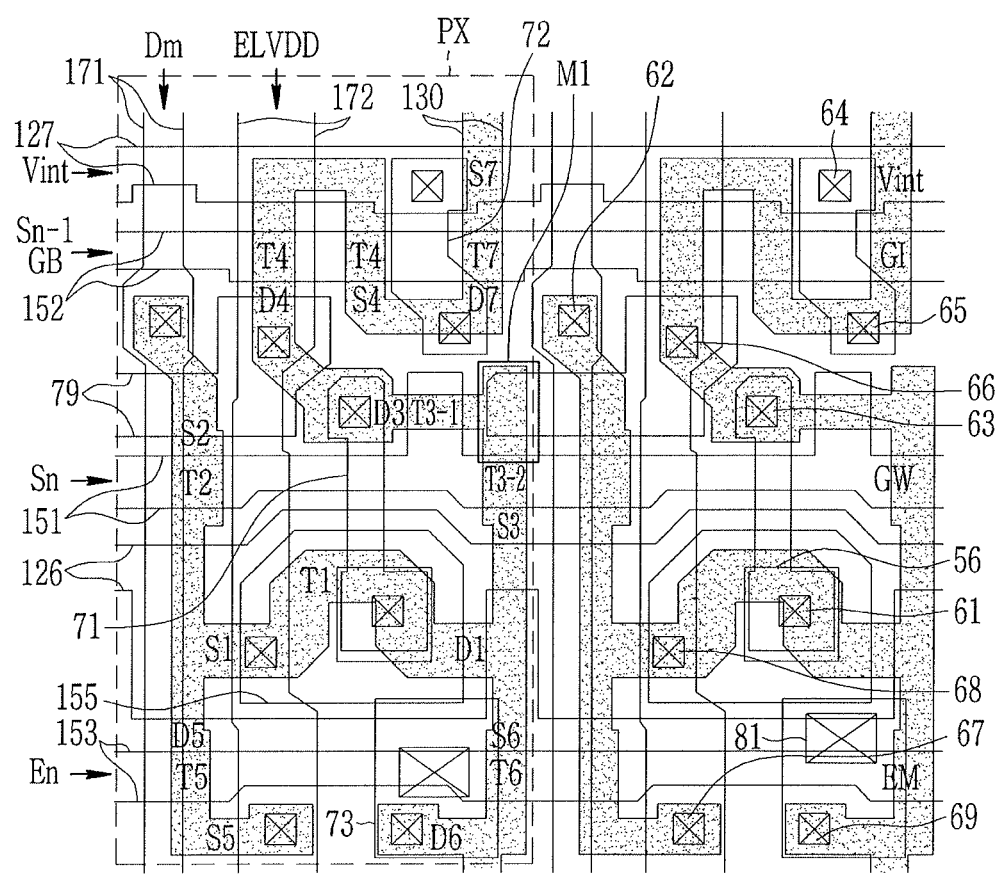
FIG. 3 illustrates a layout view of one pixel area of an organic light emitting diode display according to an example embodiment.
Figure 4:
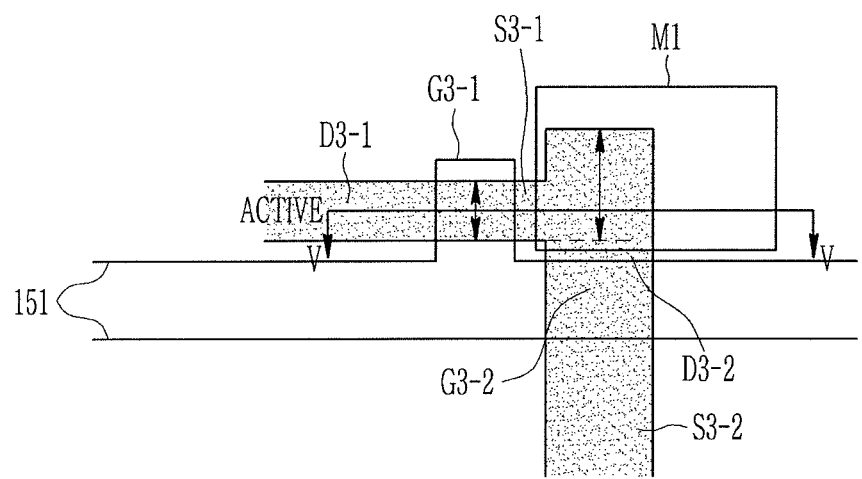
FIG. 4 illustrates an enlarged view of some of the pixel of FIG. 3.
Figure 5:
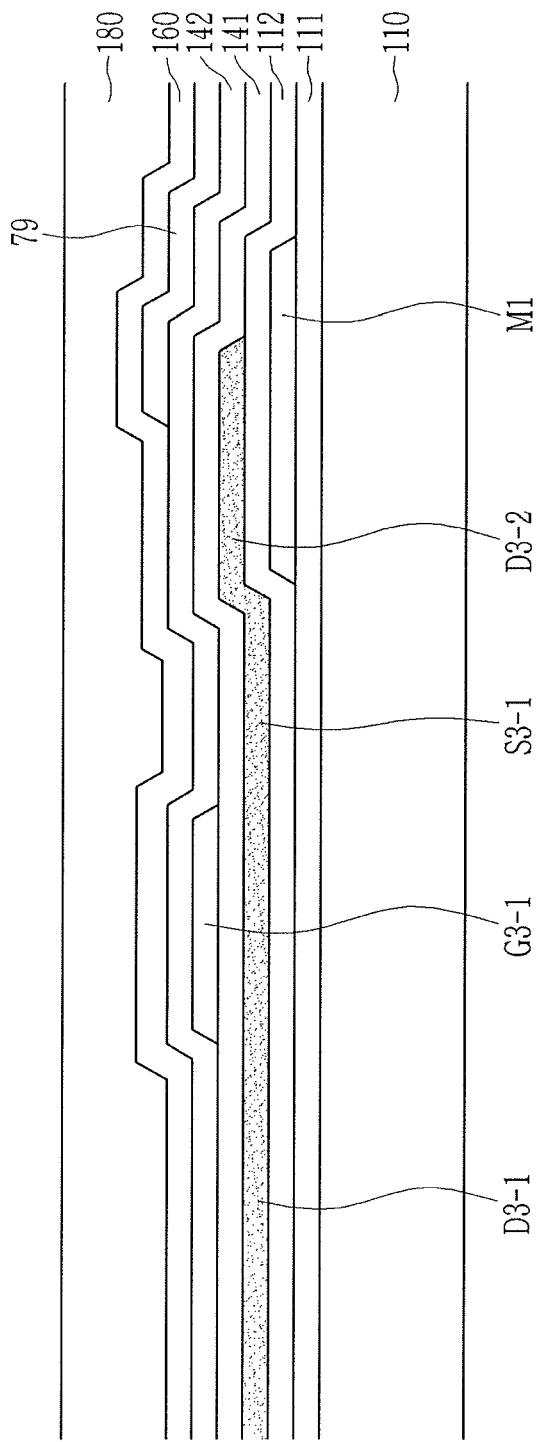
FIG. 5 illustrates a cross-sectional view taken along line V-V of FIG. 4.

FIG. 3 illustrates a layout view of one pixel area of an organic light emitting diode display according to an example embodiment, FIG. 4 illustrates an enlarged view of some of the pixel of FIG. 3, and FIG. 5 illustrates a cross-sectional view taken along line V-V of FIG. 4.

Referring to FIG. 3 to FIG. 5, the organic light emitting diode display according to the present example embodiment includes the scan line 151, the front scan line 152, the light emission control line 153, and the initialization voltage line 127 that mainly extend in a first direction and transmit the scan signal Sn, the front scan signal Sn−1, the light emission control signal EM, and the initialization voltage Vint, respectively. The bypass signal GB is transmitted through the front scan line 152. The organic light emitting diode display includes the data line 171 and the driving voltage line 172 that extend in a second direction crossing the first direction and transmit the data voltage Dm and the driving voltage ELVDD, respectively.

According to the present example embodiment, the organic light emitting diode display includes the driving transistor T1, the second transistor T2, the third transistor T3, the fourth transistor T4, the fifth transistor T5, the sixth transistor T6, the seventh transistor T7, the storage capacitor Cst, and the organic light emitting diode OLED. The overlapping layer M1 overlaps the portion (the third node) at which the 3-1 transistor T3-1 and the 3-2 transistor T3-2 of the third transistor T3 are connected, so that the additional storage capacitor is formed.

The overlapping layer M1 may be formed of a metal having a conductive characteristic or a semiconductor material corresponding to the metal. The overlapping layer M1 according to the present example embodiment of FIG. 3 is disposed between a substrate 110 (which may be flexible and which may be formed of plastic or polyimide (PI)) and a semiconductor layer. In the present example embodiment, the overlapping layer M1 overlaps the third node at which two transistors T3-1 and T3-2 are connected in the third transistor T3 in a plan view, and may overlap at least some of other portions of the two transistors T3-1 and T3-2. The overlapping layer M1 is in a floating state and is not electrically connected to the other portions. In FIG. 3, the overlapping layer M1 is indicated by a thicker line than other portions in order to clearly show it.

The portion at which the two transistors T3-1 and T3-2 overlapping the overlapping layer M1 are connected is disposed on the semiconductor layer, and the semiconductor layer further includes an additional capacitance portion. The additional capacitance portion will be described with reference to FIG. 4 and FIG. 5.

FIG. 4 illustrates an enlarged view of only a peripheral structure of the third transistor T3, showing the scan line 151, the overlapping layer M1, and a semiconductor layer ACTIVE therearound, and FIG. 5 illustrates a cross-sectional view taken along line V-V of FIG. 4.

The scan line 151 extends in the first direction, and the gate electrode G3-1 of the 3-1 transistor T3-1 upwardly protrudes. In addition, a portion where the scan line 151 overlaps the semiconductor layer ACTIVE is the gate electrode G3-2 of the 3-2 transistor T3-2, and unlike the gate electrode G3-1 of the 3-1 transistor T3-1, it is not a protruding structure but a part of the scan line 151 extending in the first direction.

The semiconductor layer ACTIVE disposed around the third transistor T3 extends in the first direction, passes the gate electrode G3-1 of the 3-1 transistor T3-1, is bent in the second direction, and then extends downward. The semiconductor layer ACTIVE has a structure (additional capacitance portion) protruding upward at a portion bent in the second direction. Accordingly, the additional capacitance portion has a larger width than that of the semiconductor layer ACTIVE extending in the first direction. (See arrows in FIG. 4) A portion at which the semiconductor layer ACTIVE is bent corresponds to the third node N3 to which the 3-1 transistor T3-1 and the 3-2 transistor T3-2 are connected. Therefore, the additional capacitance portion is disposed in the vicinity of the third node N3.

According to the present example embodiment, the portion where the semiconductor layer ACTIVE is bent (and the additional capacitance portion) overlap the overlapping layer M1 to form the additional storage capacitor. In the present example embodiment, the overlapping layer M1 is formed to be large enough to entirely overlap the portion where the semiconductor layer ACTIVE is bent (and the additional capacitance portion) in a plan view. In the present example embodiment of FIG. 3 to FIG. 5, the additional storage capacitor is formed by using the overlapping layer M1, but in order to increase capacitance of the additional storage capacitor, the protruding structure is added to the semiconductor layer ACTIVE. Thus, an area in which the overlapping layer M1 overlaps the semiconductor layer ACTIVE (including the additional capacitance portion) increases, and thus the capacitance of the additional storage capacitor increases.

In the present example embodiment of FIG. 3 to FIG. 5, the overlapping layer M1 is disposed between the semiconductor layer ACTIVE and the substrate 110, and the overlapping layer M1 may be formed of a metal having conductivity or a semiconductor material corresponding to the metal.

Referring back to FIG. 3, the organic light emitting diode OLED includes a pixel electrode, an organic emission layer, and a common electrode.

According to the present example embodiment, a channel of each of the driving transistor T1, the second transistor T2, the third transistor T3, the fourth transistor T4, the fifth transistor T5, the sixth transistor T6, and the seventh transistor T7 is disposed in a semiconductor layer 130 extending long. In addition, at least some of the first and second electrodes of the plurality of transistors T1, T2, T3, T4, T5, T6, and T7 are also disposed in the semiconductor layer 130. The semiconductor layer 130 is shown to be easily distinguished from other layers by adding shading thereto in FIG. 3. The semiconductor layer 130 may be variously bent, unlike the structure shown in FIG. 3. The semiconductor layer 130 may include a polycrystalline semiconductor such as polysilicon, or an oxide semiconductor.

According to the present example embodiment, the semiconductor layer 130 includes a channel doped with n-type impurities or p-type impurities, and a first doped region and a second doped region that are disposed at opposite sides of the channel have a higher doping concentration than that of the impurities doped in the channel. The first doped region and the second doped region respectively correspond to the first electrodes and the second electrodes of the plurality of transistors T1, T2, T3, T4, T5, T6, and T7, and when one of the first doped region and the second doped region is a source region, the other one is a drain region. In the semiconductor layer 130, regions between the first and second electrodes of two different transistors are also doped, so that the two transistors may be electrically connected to each other.

According to the present example embodiment, each of the channels of the plurality of transistors T1, T2, T3, T4, T5, T6, and T7 overlaps the gate electrode of each of the transistors T1, T2, T3, T4, T5, T6, and T7, and is disposed between the first electrode and the second electrode of each of the transistors T1, T2, T3, T4, T5, T6, and T7. The plurality of transistors T1, T2, T3, T4, T5, T6, and T7 may have substantially the same stacked structure. Hereinafter, the driving transistor T1 will be mainly described in detail, and the remaining transistors T2, T3, T4, T5, T6, and T7 will be briefly described.

According to the present example embodiment, the driving transistor T1 includes a channel, a gate electrode 155, the first electrode S1, and the second electrode D1. The channel of the driving transistor T1 is between the first electrode S1 and the second electrode D1, and overlaps the gate electrode 155 in a plan view. The channel is curved in order to form a long channel in a limited region. A driving range of the gate voltage Vg applied to the gate electrode 155 of the driving transistor T1 is widened as a length of the channel increases, and the driving current Id steadily increases in accordance with the gate voltage Vg. Accordingly, a gradation of light emitted from the organic light emitting diode OLED may be finely controlled by changing the gate voltage Vg, and the display quality of the organic light emitting diode display may also be improved. In the present example embodiment, the channel extends in several directions rather than extending in one direction. Thus, effects due to directionality are offset in a manufacturing process, which may help reduce an effect of process dispersion. Therefore, may be possible to reduce or prevent degradation in image quality such as spot defects (for example, a luminance difference occurring depending on pixels even if the same data voltage Dm is applied) that might occur due to the characteristic of the driving transistor T1 being varied according to the region of the display device due to process dispersion. The shape of the channel may have the illustrated 12 shape or various shapes.

According to the present example embodiment, the gate electrode 155 overlaps the channel in a plan view. The first electrode S1 and the second electrode D2 are disposed at opposite sides of the channel. An extended portion of a storage line 126 is isolated and disposed on the gate electrode 155. The extended portion of the storage line 126 overlaps the gate electrode 155 with a second gate insulating layer therebetween in a plan view to form the storage capacitor Cst. The extended portion of the storage line 126 is a first electrode (E1 of FIG. 1) of the storage capacitor Cst, and the gate electrode 155 is a second storage electrode (E2 of FIG. 1). The extended portion of the storage line 126 is provided with an opening 56 so that the gate electrode 155 may be connected to a first data connecting member 71. In the opening 56, an upper surface of the gate electrode 155 and the first data connecting member 71 are electrically connected through an opening 61. The first data connecting member 71 is connected to the second electrode D3 of the third transistor T3 to connect the gate electrode 155 of the driving transistor T1 and the second electrode D3 of the third transistor T3.

The gate electrode of the second transistor T2 may be a portion of the scan line 151. According to the present example embodiment, the data line 171 is connected to the first electrode of the second transistor T2 through an opening 62, and the first electrode S2 and the second electrode D2 may be disposed on the semiconductor layer 130.

According to the present example embodiment, the third transistor T3 is formed of the two transistors T3-1 and T3-2 that are adjacent and connected to each other in series. The third transistor T3 may be connected in series to block a leakage current from flowing. A structure in which the two transistors are connected in series is described with reference to one third transistor T3, and the first electrode S3 of the third transistor T3 (which corresponds to the first electrode S3-2 of the 3-2 transistor T3-2) is connected to the first electrode S6 of the sixth transistor T6 and the second electrode D1 of the driving transistor T1. In the present example embodiment, the second electrode D3 of the third transistor T3 (which corresponds to the second electrode D3-1 of the 3-1 transistor T3-1) is connected to the first data connecting member 71 through an opening 63.

According to the present example embodiment, the fourth transistor T4 also includes the two fourth transistors T4 connected in series to each other, and the two fourth transistors T4 are formed at a portion where the front scan line 152 and the semiconductor layer 130 meet. A gate electrode of the fourth transistor T4 may be a portion of the front scan line 152. The first electrode of one fourth transistor T4 is connected to the second electrode of the third transistor T3. As described above, the series connection structure may serve to block a leakage current. A second data connecting member 72 is connected to the first electrode S4 of the fourth transistor T4 through an opening 65, and the first data connecting member 71 is connected to the second electrode D2 of the fourth transistor T4 through the opening 63.

A gate electrode of the fifth transistor T5 may be a portion of the light emission control line 153. According to the present example embodiment, the driving voltage line 172 is connected to the first electrode S5 of the fifth transistor T5 through an opening 67, and the second electrode D5 is connected to the first electrode S1 of the driving transistor T1 through the semiconductor layer 130.

A gate electrode of the sixth transistor T6 may be a portion of the light emission control line 153. According to the present example embodiment, a third data connecting member 73 is connected to the second electrode D6 of the sixth transistor T6 through an opening 69, and the first electrode S6 is connected to the second electrode D1 of the driving transistor through the semiconductor layer 130.

A gate electrode of the seventh transistor T7 may be a portion of the front scan line 152. According to the present example embodiment, the third data connecting member 73 is connected to the first electrode S7 of the seventh transistor T7 through an opening 81, and the second electrode is connected to the first electrode S4 of the fourth transistor T4.

According to the present example embodiment, the storage capacitor Cst includes the first storage electrode E1 and the second storage electrode E2 which overlap each other with a second gate insulating layer 142 therebetween. The second storage electrode E2 corresponds to the gate electrode 155 of the driving transistor T1, and the first storage electrode E1 may be the extended portion of the storage line 126. According to the present example embodiment, the second gate insulating layer 142 (see FIG. 5) becomes a dielectric, and a capacitance is determined by a charge stored in the storage capacitor Cst and a voltage between the first and second storage electrodes E1 and E2. By using the gate electrode 155 as the second storage electrode E2, a space may be formed for the storage capacitor Cst in a space that is narrowed by the channel of the driving transistor T1 occupying a large area in the pixel.

According to the present example embodiment, the driving voltage line 172 is connected to the first storage electrode E1 through an opening 68. Accordingly, the storage capacitor Cst stores a charge corresponding to a difference between the driving voltage ELVDD transmitted to the first storage electrode E1 through the driving voltage line 172 and the gate voltage Vg of the gate electrode 155.

According to the present example embodiment, the second data connecting member 72 is connected to the initialization voltage line 127 through an opening 64. An electrode called a pixel electrode is connected to the third data connecting member 73 through the opening 81.

A parasitic capacitor control pattern 79 may be formed on the third node N3 of the third transistor T3. A parasitic capacitor exists in the pixel, and image quality characteristics may change when the voltage applied to the parasitic capacitor is changed. According to the present example embodiment, the driving voltage line 172 is connected to the parasitic capacitor control pattern 79 through an opening 66. Therefore, changes in the image quality characteristic may be reduced or prevented by applying the driving voltage ELVDD, which is a constant DC voltage, to the parasitic capacitor. The parasitic capacitor control pattern 79 may be formed in a different area from that shown, and a voltage other than the driving voltage ELVDD may be applied. In an example embodiment, the parasitic capacitor control pattern 79 may be omitted due to the overlapping layer M1.

Hereinafter, an overall sectional structure of the organic light emitting diode display according to an example embodiment will be described according to a stacked order with reference to FIG. 5.

In the organic light emitting diode display according to the present example embodiment, the substrate 110 is flexible and formed of a flexible material such as plastic or polyimide (PI). A barrier layer 111 is disposed on the substrate 110, and the overlapping layer M1 formed of a conductive metal or a semiconductor material having the same conductive property is disposed on the barrier layer 111. A buffer layer 112 is disposed on the overlapping layer M1. The barrier layer 111 and the buffer layer 112 may include an inorganic insulating material such as a silicon oxide, a silicon nitride, and an aluminum oxide, and may also include an organic insulating material such as polyimide and polyacryl (for example, to which epoxy is added).

According to the present example embodiment, the semiconductor layer 130 including the channels, the first electrodes, and the second electrodes of the plurality of transistors T1, T2, T3, T4, T5, T6, and T7 is disposed on the buffer layer 112. A first gate insulating layer 141 is disposed on the semiconductor layer 130 to cover it.

According to the present example embodiment, a first gate conductor, which includes the gate electrodes (the second storage electrodes E2) of the plurality of transistors T1, T2, T3, T4, T5, T6, and T7, the scan line 151, the front scan line 152, and the light emission control line 153, is disposed on the first gate insulating layer 141.

According to the present example embodiment, the second gate insulating layer 142 covering the first gate conductor is disposed on the first gate conductor. The first gate insulating layer 141 and the second gate insulating layer 142 may be formed of a material such as a silicon nitride, a silicon oxide, and an aluminum oxide.

According to the present example embodiment, a second gate conductor, which includes the storage line 126, the first storage electrode E1, the initialization voltage line 127, and the parasitic capacitor control pattern 79, is disposed on the second gate insulating layer 142.

According to the present example embodiment, an interlayer insulating layer 160 covering the second gate conductor is disposed on the second gate conductor. The interlayer insulating layer 160 may be formed of a material such as a silicon nitride, a silicon oxide, and an aluminum oxide, and may also be formed of an organic insulating material.

According to the present example embodiment, a data conductor, which includes the data line 171, the driving voltage line 172, the first data connecting member 71, the second data connecting member 72, and the third data connecting member 73, is disposed on the interlayer insulating layer 160.

According to the present example embodiment, a passivation layer 180 covering the data conductor is disposed on the data conductor. The passivation layer 180, which may be a planarizing layer, may include an organic insulating material.

According to the present example embodiment, a pixel electrode is disposed on the passivation layer 180. The pixel electrode is connected to the third data connecting member 73 through the opening 81 formed in the passivation layer 180. A partition wall is disposed on the passivation layer 180 and the pixel electrode. The partition wall is provided with an open portion overlapping the pixel electrode, and the organic light emitting layer is disposed in the open portion. A common electrode is disposed on the organic light emitting layer and the partition wall. The pixel electrode, the organic light emitting layer, and the common electrode form the organic light emitting diode OLED.

In an example embodiment, the pixel electrode may be an anode, which is a hole injection electrode, and the common electrode may be a cathode, which is an electron injection electrode. Conversely, the pixel electrode may be a cathode, and the common electrode may be an anode. When holes and electrons are injected into the organic light emitting layer from the pixel electrode and the common electrode, respectively, light is emitted when excitons in which the injected holes and electrons are combined enter a ground state from an excited state.

According to the present example embodiment, the scan line 151, the front scan line 152, and the light emission control line 153 formed by the first gate conductor extend in the first direction, and the storage line 126 and the initialization voltage line 127 formed by the second gate conductor also extend in the first direction. The data line 171 and the driving voltage line 172 formed by the data conductors extend in the second direction.

According to the present example embodiment, the data line 171 is connected to the first electrode S2 of the second transistor T2 through the opening 62 formed in the first gate insulating layer 141, the second gate insulating layer 142, and the interlayer insulating layer 160.

According to the present example embodiment, the driving voltage line 172 is connected to the first electrode S5 of the fifth transistor T5 through the opening 67 formed in the first gate insulating layer 141, the second gate insulating layer 142, and the interlayer insulating layer 160, is connected to the extended portion of the storage line 126 (the first storage electrode E1) through the opening 68 formed in the interlayer insulating layer 160, and is connected to the parasitic capacitor control pattern 79 through the opening 66 formed in the interlayer insulating layer 160.

According to the present example embodiment, one end of the first data connecting member 71 is connected to the gate electrode 155 through the opening 61 formed in the second gate insulating layer 142 and the interlayer insulating layer 160, and the other end thereof is connected to the second electrode D3 of the third transistor T3 and the second electrode D4 of the fourth transistor T4 through the opening 63 formed in the first gate insulating layer 141, the second gate insulating layer 142, and the interlayer insulating layer 160.

According to the present example embodiment, one end of the second data connecting member 72 is connected to the first electrode S4 of the fourth transistor T4 through the opening 65 formed in the first gate insulating layer 141, the second gate insulating layer 142, and the interlayer insulating layer 160, and the other end thereof is connected to the initialization voltage line 127 through the opening 64 formed in the interlayer insulating layer 160.

According to the present example embodiment, the third data connecting member 73 is connected to the second electrode of the sixth transistor T6 through the opening 69 formed in the first gate insulating layer 141, the second gate insulating layer 142, and the interlayer insulating layer 160.

According to the present example embodiment, an encapsulation layer for protecting the organic light emitting diode OLED is disposed on the common electrode. The encapsulation layer may contact the common electrode, or may be spaced apart from the common electrode. The encapsulation layer may be a thin film encapsulation layer in which an inorganic film and an organic film are stacked, and may include a triple layer formed of an inorganic film, an organic film, and an inorganic film. A capping layer and a functional layer may be disposed between the common electrode and the encapsulation layer.

FIG. 5 illustrates the structure in which the overlapping layer M1 is electrically connected in detail.

According to the present example embodiment, referring to FIG. 4, the barrier layer 111 is disposed on the substrate 110, and the overlapping layer M1 is disposed on the barrier layer 111. As shown in FIG. 3, a position of the overlapping layer M1 is a position overlapping the third transistor T3 in a plan view. The overlapping layer M1 is disposed on the buffer layer 112. The semiconductor layer 130 is disposed on the buffer layer 112. In FIG. 5, the second electrode D3-1 and the first electrode S3-1 of the 3-1 transistor T3-1 and the second electrode D3-2 of the 3-2 transistor T3-2 are shown, and the channel of the 3-1 transistor T3-1 is disposed between the second electrode D3-1 and the first electrode S3-1 of the 3-1 transistor T3-1.

According to the present example embodiment, the first gate insulating layer 141 is disposed on a semiconductor layer of the third transistor T3 and the buffer layer 112. The gate electrode G3-1 of the 3-1 transistor T3-1 is disposed on the first gate insulating layer 141. The second gate insulating layer 142 is disposed on the gate electrode G3-1 of the 3-1 transistor T3-1.

According to the present example embodiment, the parasitic capacitor control pattern 79 is disposed on the second gate insulating layer 142. The interlayer insulating layer 160 is disposed on the parasitic capacitor control pattern 79. The passivation layer 180 is disposed on the interlayer insulating layer 160. The pixel electrode, the organic light emitting layer, the common electrode, and the encapsulation layer may be disposed on the passivation layer.

According to the present example embodiment, the overlapping layer M1 of FIG. 3 to FIG. 5 is floated and overlaps a portion at which the semiconductor layer ACTIVE is bent in the third transistor T3, and is disposed above the substrate 110 and below the semiconductor layer 130 to be disposed between the barrier layer 111 and the buffer layer 112. The semiconductor layer ACTIVE, which overlaps the overlapping layer M1 and forms the additional storage capacitor, includes an upward protruding portion (additional capacitance portion).

According to the present example embodiment, in the structure of FIG. 3 to FIG. 5, the overlapping layer M1 and the parasitic capacitor control pattern 79 exist as layers overlapping the third node, the overlapping layer M1 is floated, and the driving voltage ELVDD is applied to the parasitic capacitor control pattern 79.

In an example embodiment, the overlapping layer M1 may not be disposed between the semiconductor layer ACTIVE and the substrate 110, but may be disposed above the semiconductor layer ACTIVE and may be formed of one of the first gate conductor, the second gate conductor, and the data conductor.

Figure 6:
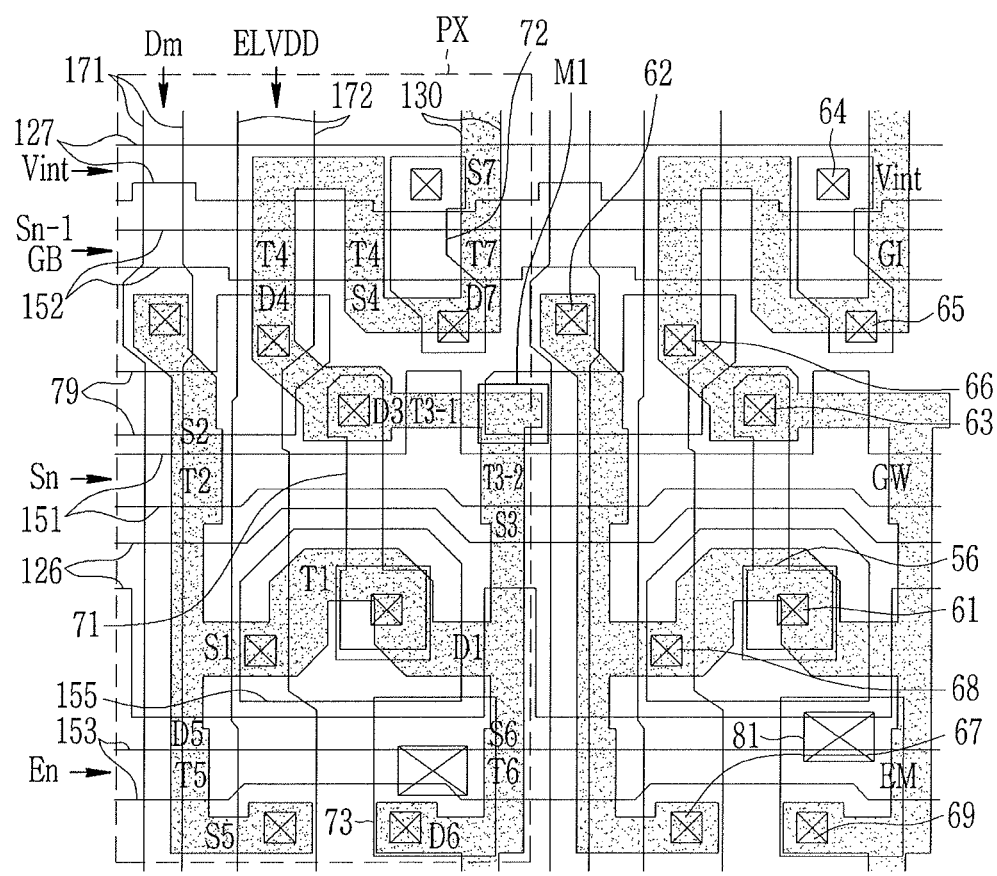
FIG. 6 illustrates a layout view of one pixel area of an organic light emitting diode display according to an example embodiment.
Figure 7:
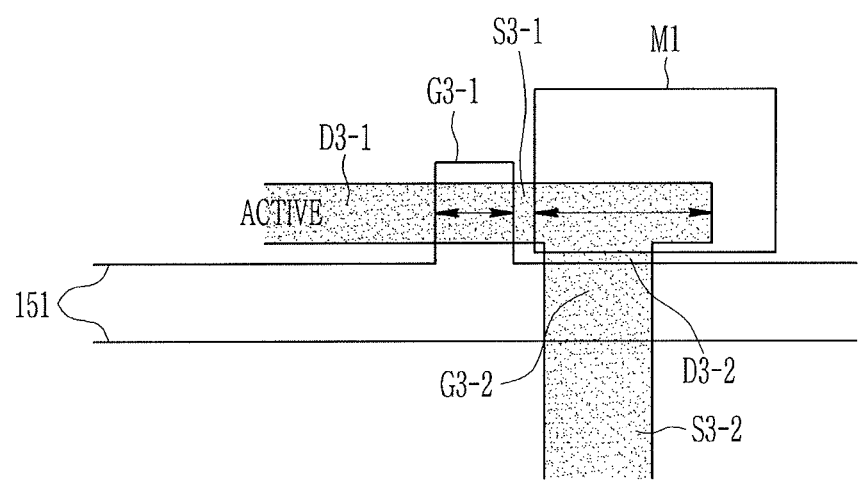
FIG. 7 illustrates an enlarged view of some of the pixel of FIG. 6.

In an example embodiment, the additional capacitance portion of the semiconductor layer may have a structure as shown in FIG. 6 and FIG. 7.

FIG. 6 illustrates a layout view of one pixel area of an organic light emitting diode display according to an example embodiment, and FIG. 7 illustrates an enlarged view of some of the pixel of FIG. 6.

The organic light emitting diode display according to the present example embodiment of FIG. 6 and FIG. 7 is similar to the organic light emitting diode display of FIG. 3 and FIG. 4 in that they include the overlapping layer M1 and in their overall structures, but there is a difference between shapes the semiconductor layer ACTIVE overlapping the overlapping layer M1.

Hereinafter, elements other than the elements previously described in FIG. 3 to FIG. 5 will be mainly described with reference to FIG. 6 and FIG. 7.

FIG. 7 shows an enlarged view of a difference (an additional capacitance portion of the semiconductor layer ACTIVE) from the previously described example embodiment, so that the current example embodiment will be mainly described with reference to FIG. 7.

The example embodiment of FIG. 7 includes the additional capacitance portion of the semiconductor layer ACTIVE, differently from that of the example embodiment of FIG. 4. Thus, in FIG. 7, the additional capacitance portion of the semiconductor layer ACTIVE protrudes in the first direction, for example, protrudes in a right direction.

FIG. 7, which is an enlarged view of only the peripheral structure of the third transistor T3, illustrates the scan line 151, the overlapping layer M1, and the semiconductor layer ACTIVE therearound.

A structure of the scan line 151 is the same as that of FIG. 4.

According to the present example embodiment, the semiconductor layer ACTIVE disposed around the third transistor T3 extends in the first direction, passes the gate electrode G3-1 of the 3-1 transistor T3-1, is bent in the second direction, and then extends downward. The semiconductor layer ACTIVE has a structure (additional capacitance portion) protruding in the first direction at a portion bent in the second direction. Accordingly, the additional capacitance portion has a larger width than that of the gate electrode G3-1 of the 3-1 transistor T3-1. (See arrows of FIG. 7) In the present example embodiment, the additional capacitance portion has a larger width than that of the semiconductor layer ACTIVE extending in the second direction. The portion at which the semiconductor layer ACTIVE is bent corresponds to the third node N3 to which the 3-1 transistor T3-1 and the 3-2 transistor T3-2 are connected. Therefore, the additional capacitance portion is disposed in the vicinity of the third node N3.

According to the present example embodiment, the overlapping layer M1 is disposed between the substrate 110 formed of plastic or polyimide (PI) and the semiconductor layer. The overlapping layer M1 is formed to be large enough to entirely overlap the portion where the semiconductor layer ACTIVE is bent and the additional capacitance portion in a plan view. In the present example embodiment, the overlapping layer M1 overlaps the third node at which two transistors T3-1 and T3-2 are connected in the third transistor T3 in a plan view, and may overlap at least some of other portions of the two transistors T3-1 and T3-2. The overlapping layer M1 has a floating state and is not electrically connected to the other portions.

According to the present example embodiment, the portion where the semiconductor layer ACTIVE is bent and the additional capacitance portion overlap the overlapping layer M1 to form the additional storage capacitor. Thus, the overlapping layer M1 overlaps the portion (the third node N3) at which the 3-1 transistor T3-1 and the 3-2 transistor T3-2 of the third transistor T3 are connected, so that the additional storage capacitor is formed.

In the present example embodiment of FIG. 6 and FIG. 7, the additional storage capacitor is formed by using the overlapping layer M1, but in order to increase capacitance of the additional storage capacitor, the protruding structure is added to the semiconductor layer ACTIVE. Thus, an area in which the overlapping layer M1 overlaps the semiconductor layer ACTIVE (including the additional capacitance portion) increases, and as a result, the capacitance of the additional storage capacitor increases. Accordingly, a voltage change at the third node N3 is buffered, and a kickback voltage of the third transistor T3 is reduced. Thus, an afterimage may be reduced or prevented. In the present example embodiment, the overlapping layer M1 overlaps the third transistor T3 and is disposed between the substrate and the third transistor T3. Thus, the third transistor T3 may have a desired characteristic by preventing impurities from coming from the flexible substrate made of plastic or polyimide (PI) when the third transistor T3 is manufactured.

In the present example embodiment of FIG. 6 and FIG. 7, the overlapping layer M1 is disposed between the semiconductor layer ACTIVE and the substrate 110, and the overlapping layer M1 may be formed of a metal having conductivity or a semiconductor material corresponding to the metal. In the present example embodiment of FIG. 6 and FIG. 7, the cross-sectional view is the same as the cross-sectional view of FIG. 5.

According to the present example embodiment, in the structure of FIG. 6 and FIG. 7, the overlapping layer M1 and the parasitic capacitor control pattern 79 exist as layers overlapping the third node, the overlapping layer M1 is floated, and the driving voltage ELVDD is applied to the parasitic capacitor control pattern 79.

The example embodiment of FIG. 6 and FIG. 7 and the example embodiment of FIG. 3 to FIG. 5 have the same characteristics, except for the structure of the additional capacitance portion of the semiconductor layer ACTIVE overlapping the overlapping layer M1. Thus, the present example embodiment of FIG. 6 and FIG. 7 may be illustrated as the same circuit diagram as that of FIG. 1, and may receive the same timing signal as that shown in FIG. 2 to operate.

In an example embodiment, the overlapping layer M1 may not be disposed between the semiconductor layer ACTIVE and the substrate 110, but may be disposed above the semiconductor layer ACTIVE and may be formed of one of the first gate conductor, the second gate conductor, and the data conductor.

Figure 8:
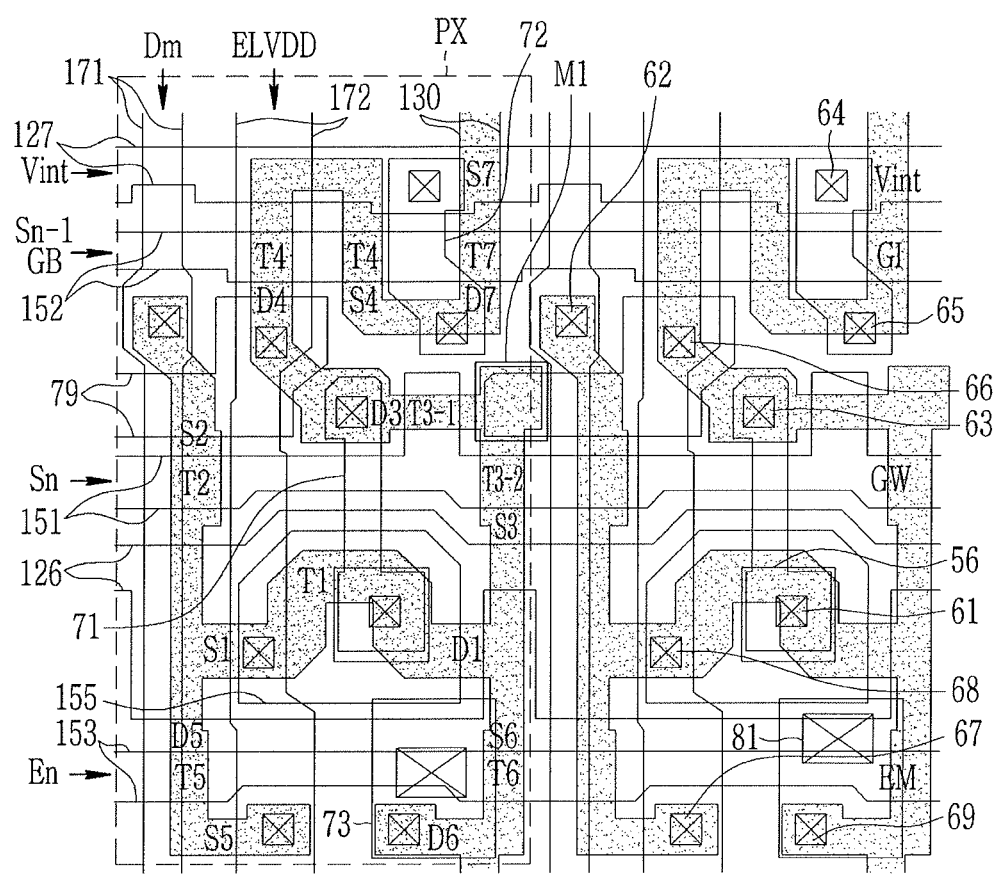
FIG. 8 illustrates a layout view of one pixel area of an organic light emitting diode display according to an example embodiment.
Figure 9:
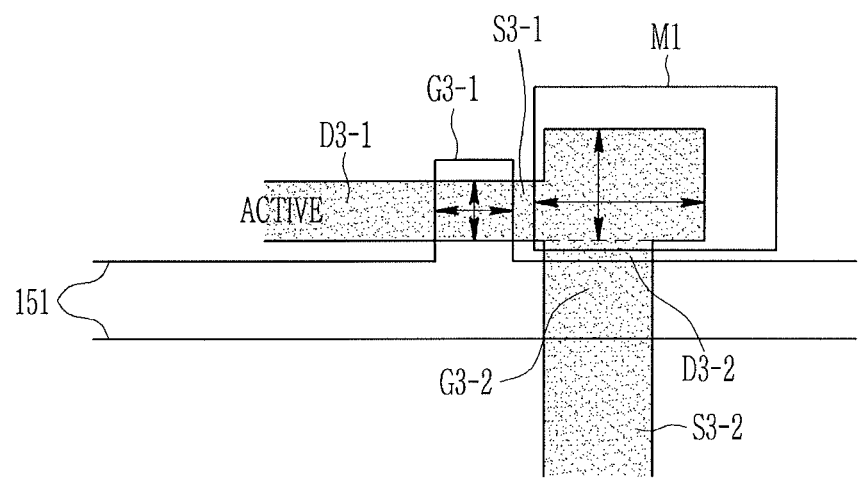
FIG. 9 illustrates an enlarged view of some of the pixel of FIG. 8.

In an example embodiment, the additional capacitance portion of the semiconductor layer may have a structure as shown in FIG. 8 and FIG. 9.

FIG. 8 illustrates a layout view of one pixel area of an organic light emitting diode display according to an example embodiment, and FIG. 9 illustrates an enlarged view of some of the pixel of FIG. 8.

The organic light emitting diode display according to the present example embodiment of FIG. 8 and FIG. 9 is similar to the organic light emitting diode display of FIG. 3 and FIG. 4 in that they include the overlapping layer M1 and in their overall structures, but there is a difference between shapes of the semiconductor layer ACTIVE overlapping the overlapping layer M1.

Hereinafter, elements other than those previously described in FIG. 3 to FIG. 5 will be mainly described with reference to FIG. 8 and FIG. 9.

FIG. 9 shows an enlarged view of a difference (an additional capacitance portion of the semiconductor layer ACTIVE) from the previously described example embodiment, so that the present example embodiment will be mainly described with reference to FIG. 9.

The example embodiment of FIG. 9 has an additional capacitance portion of the semiconductor layer ACTIVE having a different structure from that of the example embodiment of FIG. 4. Thus, in FIG. 9, the additional capacitance portion of the semiconductor layer ACTIVE extends in an upward direction and in the first direction.

FIG. 9, which is an enlarged view of only the peripheral structure of the third transistor T3, illustrates the scan line 151, the overlapping layer M1, and the semiconductor layer ACTIVE therearound.

According to the present example embodiment, a structure of the scan line 151 is the same as that of FIG. 4.

According to the present example embodiment, the semiconductor layer ACTIVE disposed around the third transistor T3 extends in the first direction, passes the gate electrode G3-1 of the 3-1 transistor T3-1, is bent in the second direction, and then extends downward. The semiconductor layer ACTIVE has a structure (additional capacitance portion) protruding in the upward and first direction at a portion bent in the second direction. Accordingly, the additional capacitance portion has a larger width than that of the semiconductor layer ACTIVE extending in the first direction, and has a larger width than that of the gate electrode G3-1 of the 3-1 transistor T3-1. (See arrows of FIG. 9) A portion at which the semiconductor layer ACTIVE is bent corresponds to the third node N3 to which the 3-1 transistor T3-1 and the 3-2 transistor T3-2 are connected. Therefore, the additional capacitance portion is disposed in the vicinity of the third node N3.

According to the present example embodiment, the overlapping layer M1 is disposed between the substrate 110 (which may be flexible and which may be formed of plastic or polyimide (PI)) and the semiconductor layer. The overlapping layer M1 is formed to be large enough to overlap all of the additional capacitance portion in a plan view. In the present example embodiment, the overlapping layer M1 overlaps the third node at which two transistors T3-1 and T3-2 are connected in the third transistor T3 in a plan view, and may overlap at least some of other portions of the two transistors T3-1 and T3-2. The overlapping layer M1 has a floating state and is not electrically connected to the other portions.

According to the present example embodiment, the portion where the semiconductor layer ACTIVE is bent and the additional capacitance portion overlap the overlapping layer M1 to form the additional storage capacitor. Thus, the overlapping layer M1 overlaps the portion (the third node N3) at which the 3-1 transistor T3-1 and the 3-2 transistor T3-2 of the third transistor T3 are connected, so that the additional storage capacitor is formed.

In the present example embodiment of FIG. 8 and FIG. 9, the additional storage capacitor is formed by using the overlapping layer M1, but in order to increase capacitance of the additional storage capacitor, the protruding structure is added to the semiconductor layer ACTIVE. Thus, an area in which the overlapping layer M1 overlaps the semiconductor layer ACTIVE (including the additional capacitance portion) increases, and as a result, the capacitance of the additional storage capacitor increases. Accordingly, a voltage change at the third node N3 is buffered, and a kickback voltage of the third transistor T3 is reduced. Thus, an afterimage may be reduced or prevented. In the present example embodiment, the overlapping layer M1 overlaps the third transistor T3 and is disposed between the substrate and the third transistor T3. Thus, the third transistor T3 may have a desired characteristic by preventing impurities from coming from the flexible substrate made of plastic or polyimide (PI) when the third transistor T3 is manufactured.

In the present example embodiment of FIG. 8 and FIG. 9, the overlapping layer M1 is disposed between the semiconductor layer ACTIVE and the substrate 110, and the overlapping layer M1 may be formed of a metal having conductivity or a semiconductor material corresponding to the metal. A cross-sectional view in the present example embodiment of FIG. 8 and FIG. 9 is the same as the cross-sectional view of FIG. 5.

In the structure of FIG. 8 and FIG. 9, the overlapping layer M1 and the parasitic capacitor control pattern 79 exist as layers overlapping the third node, the overlapping layer M1 is floated, and the driving voltage ELVDD is applied to the parasitic capacitor control pattern 79.

The example embodiment of FIG. 8 and FIG. 9 and the example embodiment of FIG. 3 to FIG. 5 have the same characteristics, except for the structure of the additional capacitance portion of the semiconductor layer ACTIVE overlapping the overlapping layer M1. Thus, the present example embodiment of FIG. 8 and FIG. 9 may be illustrated as the same circuit diagram as that of FIG. 1, and may receive the same timing signal as that shown in FIG. 2 to operate.

In an example embodiment, the overlapping layer M1 may not be disposed between the semiconductor layer ACTIVE and the substrate 110, but may be disposed above the semiconductor layer ACTIVE and may be formed of one of the first gate conductor, the second gate conductor, and the data conductor.

Figure 10:
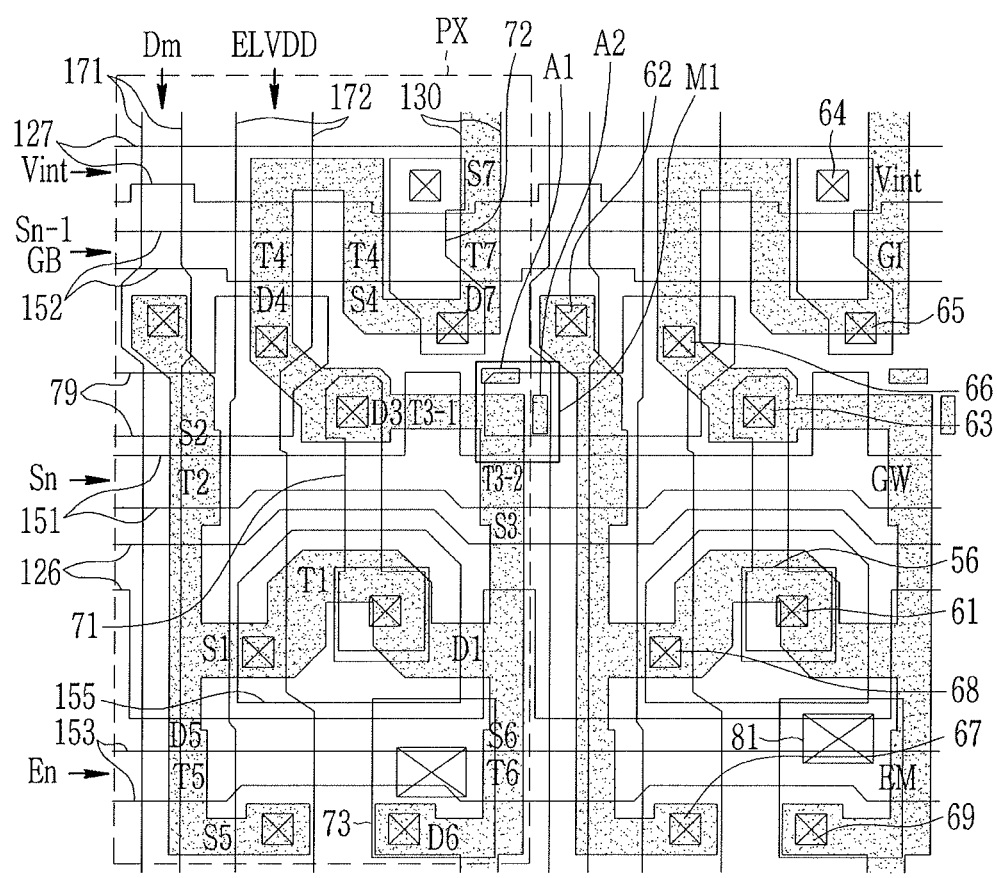
FIG. 10 illustrates a layout view of one pixel area of an organic light emitting diode display according to an example embodiment.
Figure 11:
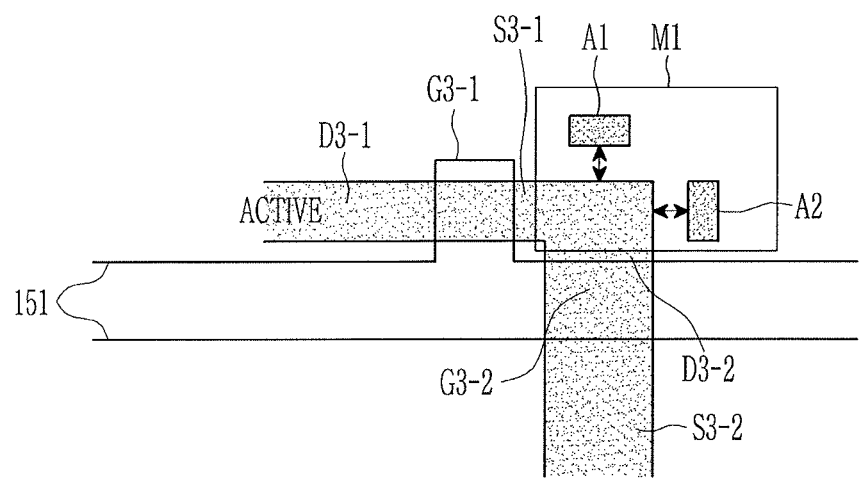
FIG. 11 illustrates an enlarged view of some of the pixel of FIG. 10.

In an example embodiment, the additional capacitance portion of the semiconductor layer may have a structure as shown in FIG. 10 and FIG. 11.

FIG. 10 illustrates a layout view of one pixel area of an organic light emitting diode display according to an example embodiment, and FIG. 11 illustrates an enlarged view of some of the pixel of FIG. 10.

The organic light emitting diode display according to the present example embodiment of FIG. 10 and FIG. 11 is similar to the organic light emitting diode display of FIG. 3 and FIG. 4 in that it includes the overlapping layer M1 and in its overall structures, but there is a difference between shapes of the semiconductor layer ACTIVE overlapping the overlapping layer M1.

Hereinafter, elements other than those previously described in FIG. 3 to FIG. 5 will be mainly described with reference to FIG. 10 and FIG. 11.

FIG. 11 shows an enlarged view of a difference (an additional capacitance portion of the semiconductor layer ACTIVE) from the previously described example embodiment, so that the current example embodiment will be mainly described with reference to FIG. 11.

The example embodiment of FIG. 11 has additional capacitance portions A1 and A2 of the semiconductor layer ACTIVE having a different structure from that of the example embodiment of FIG. 4. In FIG. 11, the additional capacitance portions A1 and A2 of the semiconductor layer ACTIVE do not extend and protrude in the semiconductor layer ACTIVE, but are spaced apart from the semiconductor layer ACTIVE by a predetermined distance. The additional capacitance portions A1 and A2 that are spaced apart by the predetermined distance may be formed of the same material as the semiconductor layer ACTIVE through the same process.

FIG. 11, which is an enlarged view of only the peripheral structure of the third transistor T3, illustrates the scan line 151, the overlapping layer M1, and the semiconductor layer ACTIVE therearound.

According to the present example embodiment, a structure of the scan line 151 is the same as that of FIG. 4.

According to the present example embodiment, the semiconductor layer ACTIVE disposed around the third transistor T3 extends in the first direction, passes the gate electrode G3-1 of the 3-1 transistor T3-1, is bent in the second direction, and then extends downward. The additional capacitance portions A1 and A2 spaced apart from the semiconductor layer ACTIVE by the predetermined distance are provided at a portion bent in the second direction. The first additional capacitance portion A1 is disposed to be spaced apart by a predetermined distance in an opposite direction to the second direction from the portion at which the semiconductor layer ACTIVE is bent. In the present example embodiment, the second additional capacitance portion A2 is disposed to be spaced apart by a predetermined distance along the first direction from the portion at which the semiconductor layer ACTIVE is bent. In the present example embodiment, two additional capacitance portions A1 and A2 are included and are spaced apart by the predetermined distance. In other implementations, a single additional capacitance portion may be included, or three additional capacitance portions may be included. The portion at which the semiconductor layer ACTIVE is bent corresponds to the third node N3 to which the 3-1 transistor T3-1 and the 3-2 transistor T3-2 are connected. Therefore, the additional capacitance portion is disposed in the vicinity of the third node N3.

According to the present example embodiment, the overlapping layer M1 is disposed between the substrate 110 (which may be flexible and which may be formed of plastic or polyimide (PI)) and the semiconductor layer. The overlapping layer M1 is formed to be large enough to overlap the portion at which the semiconductor layer ACTIVE is bent and all of the additional capacitance portions A1 and A2, in a plan view.

In the present example embodiment, the overlapping layer M1 may overlap the third node N3 at which two transistors T3-1 and T3-2 are connected in the third transistor T3 in a plan view, and may overlap at least some of the other portions of the two transistors T3-1 and T3-2. According to the present example embodiment, the overlapping layer M1 has a floating state and is not electrically connected to the other portions.

According to the present example embodiment, the portion at which the semiconductor layer ACTIVE is bent and the additional capacitance portions A1 and A2 overlap the overlapping layer M1 form the additional storage capacitor. Thus, the overlapping layer M1 overlaps the portion (the third node N3) at which the 3-1 transistor T3-1 and the 3-2 transistor T3-2 of the third transistor T3 are connected, so that the additional storage capacitor is formed.

In the present example embodiment of FIG. 10 to FIG. 11, the additional storage capacitor is formed by using the overlapping layer M1, but in order to increase capacitance of the additional storage capacitor, the protruding structure is added to the semiconductor layer ACTIVE. Thus, an area in which the overlapping layer M1 overlaps the semiconductor layer ACTIVE and the additional capacitance portions A1 and A2 increases, and as a result, the capacitance of the additional storage capacitor increases. Accordingly, a voltage change at the third node N3 is buffered, and a kickback voltage of the third transistor T3 is reduced. Thus, an afterimage may be reduced or prevented. In the present example embodiment, the overlapping layer M1 overlaps the third transistor T3 and is disposed between the substrate and the third transistor T3. Thus, the third transistor T3 may have a desired characteristic by preventing impurities from coming from the flexible substrate made of plastic or polyimide (PI) when the third transistor T3 is manufactured.

In the present example embodiment of FIG. 10 and FIG. 11, the overlapping layer M1 is disposed between the semiconductor layer ACTIVE and the substrate 110, and the overlapping layer M1 may be formed of a metal having conductivity or a semiconductor material corresponding to the metal. The cross-sectional view of the present example embodiment of FIG. 10 and FIG. 11 is the same as the cross-sectional view of FIG. 5.

According to the present example embodiment, in the structure of FIG. 10 and FIG. 11, the overlapping layer M1 and the parasitic capacitor control pattern 79 exist as layers overlapping the third node, the overlapping layer M1 is floated, and the driving voltage ELVDD is applied to the parasitic capacitor control pattern 79.

The example embodiment of FIG. 10 and FIG. 11 and the example embodiment of FIG. 3 to FIG. 5 have the same characteristics, except for the structure of the additional capacitance portions A1 and A2 of the semiconductor layer ACTIVE overlapping the overlapping layer M1. Thus, the present example embodiment of FIG. 10 and FIG. 11 may be illustrated as the same circuit diagram as that of FIG. 1, and may receive the same timing signal as that shown in FIG. 2 to operate.

In an example embodiment, the overlapping layer M1 may not be disposed between the semiconductor layer ACTIVE and the substrate 110, but may be disposed above the semiconductor layer ACTIVE and may be formed of one of the first gate conductor, the second gate conductor, and the data conductor.

Figure 12:
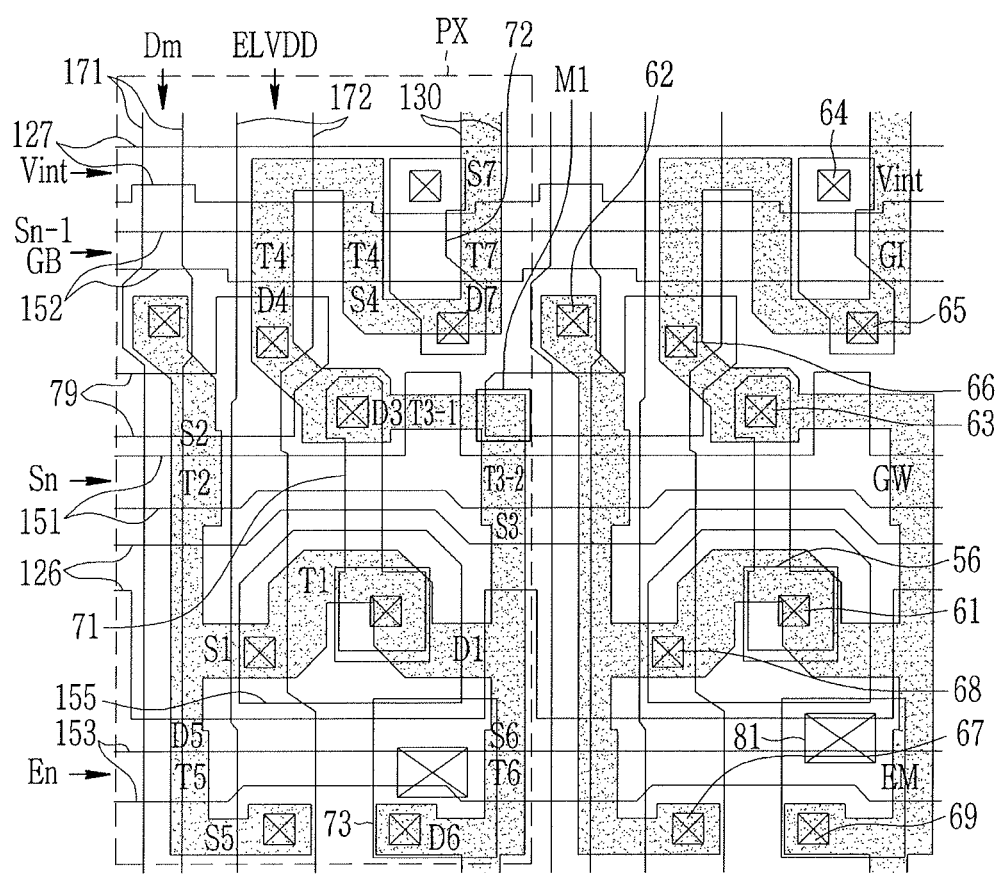
FIG. 12 illustrates a layout view of one pixel area of an organic light emitting diode display according to an example embodiment.

In an example embodiment, the additional capacitance portion of the semiconductor layer may not be included therein, as in FIG. 12. This is a case in which the variation at the kickback voltage of the third transistor T3 may be sufficiently reduced by the capacitance additionally formed by the overlapping of the portion at which the semiconductor layer ACTIVE is bent and the overlapping layer M1.

FIG. 12 illustrates a layout view of one pixel area of an organic light emitting diode display according to an example embodiment.

The organic light emitting diode display according to the present example embodiment of FIG. 12 is similar to the organic light emitting diode display of FIG. 3 and FIG. 4 in that they both include the overlapping layer M1 and in their overall structures, but there is a difference between shapes the semiconductor layer ACTIVE overlapping the overlapping layer M1. In FIG. 12, no capacitance portion is formed in the semiconductor layer ACTIVE.

In the present example embodiment, referring to FIG. 12, the semiconductor layer ACTIVE disposed around the third transistor T3 extends in the first direction, passes the gate electrode G3-1 of the 3-1 transistor T3-1, is bent in the second direction, and then extends downward. An additional capacitance portion may otherwise be omitted.

In the present example embodiment, the area of the overlapping layer M1 overlapping the bent portion (third node) of the semiconductor layer ACTIVE is relatively narrow in comparison with that of the previous example embodiment.

In the present example embodiment, the overlapping layer M1 is disposed between the substrate 110 (which may be flexible and which may be formed of plastic or polyimide (PI)) and the semiconductor layer. In the present example embodiment, the overlapping layer M1 has a floating state and is not electrically connected to the other portions.

The capacitance of the additional storage capacitor of the present example embodiment of FIG. 12 is relatively small in comparison with that of the example embodiments of FIG. 1 to FIG. 11. Therefore, the present example embodiment of FIG. 12 may be suitable where a larger capacitance is not needed to reduce the variation of the kickback voltage of the third transistor T3.

In the present example embodiment of FIG. 12, due to the capacitance of the additional storage capacitor caused by overlapping the overlapping layer M1 and the semiconductor layer ACTIVE, a voltage change at the third node N3 is buffered, and a kickback voltage of the third transistor T3 is reduced. Thus, an afterimage may be reduced or prevented. In the present example embodiment, the overlapping layer M1 overlaps the third transistor T3 and is disposed between the substrate and the third transistor T3. Thus, the third transistor T3 may have a desired characteristic by preventing impurities from coming from the flexible substrate made of plastic or polyimide (PI) when the third transistor T3 is manufactured.

In the present example embodiment, in the structure of FIG. 12, the overlapping layer M1 and the parasitic capacitor control pattern 79 exist as layers overlapping the third node, the overlapping layer M1 is floated, and the driving voltage ELVDD is applied to the parasitic capacitor control pattern 79.

The cross-sectional view in the present example embodiment of FIG. 12 is the same as the cross-sectional view of FIG. 5. In the present example embodiment, the present example embodiment of FIG. 12 may also be illustrated as the same circuit diagram as that of FIG. 1, and may receive the same timing signal as that shown in FIG. 2 to operate.

In an example embodiment, the overlapping layer M1 may not be disposed between the semiconductor layer ACTIVE and the substrate 110, but may be disposed above the semiconductor layer ACTIVE and may be formed of one of the first gate conductor, the second gate conductor, and the data conductor.

If the overlapping layer M1 is formed of the second gate conductor, it may be disposed on the same layer as the parasitic capacitor control pattern 79 (see, for example, FIG. 3, FIG. 6, FIG. 8, FIG. 10, and FIG. 12). In this case, there may be considered an approach in which the parasitic capacitor control pattern 79 is not formed, or the overlapping layer M1 is omitted while the parasitic capacitor control pattern 79 is maintained.

First, the parasitic capacitor control pattern 79 is removed relative to FIG. 3, FIG. 6, FIG. 8, FIG. 10, and FIG. 12, such that the parasitic capacitor control pattern 79 may not be formed. In this case, the opening 66 may also be eliminated because the opening 66 electrically connects the parasitic capacitor control pattern 79 and the driving voltage line 172.

Also, in order for the overlapping layer M1 to be omitted while the parasitic capacitor control pattern 79 is maintained, the overlapping layer M1 may be removed relative to FIG. 3, FIG. 6, FIG. 8, FIG. 10, and FIG. 12. The parasitic capacitor control pattern 79 serves as the overlapping layer. In the present example embodiment, the opening 66 is eliminated and the overlapped layer is floated.

In the present example embodiment, the overlapping layer M1 is not electrically connected to the other portions and is floated. In another implementation, the overlapping layer M1 may be electrically connected to the other portions in the pixel to receive various voltages.

Hereinafter, an example embodiment in which the driving voltage ELVDD as one of the various voltages applicable to the overlapping layer M1 is applied will be described.

A circuit structure thereof will now be described with reference to FIG. 13.

Figure 13:
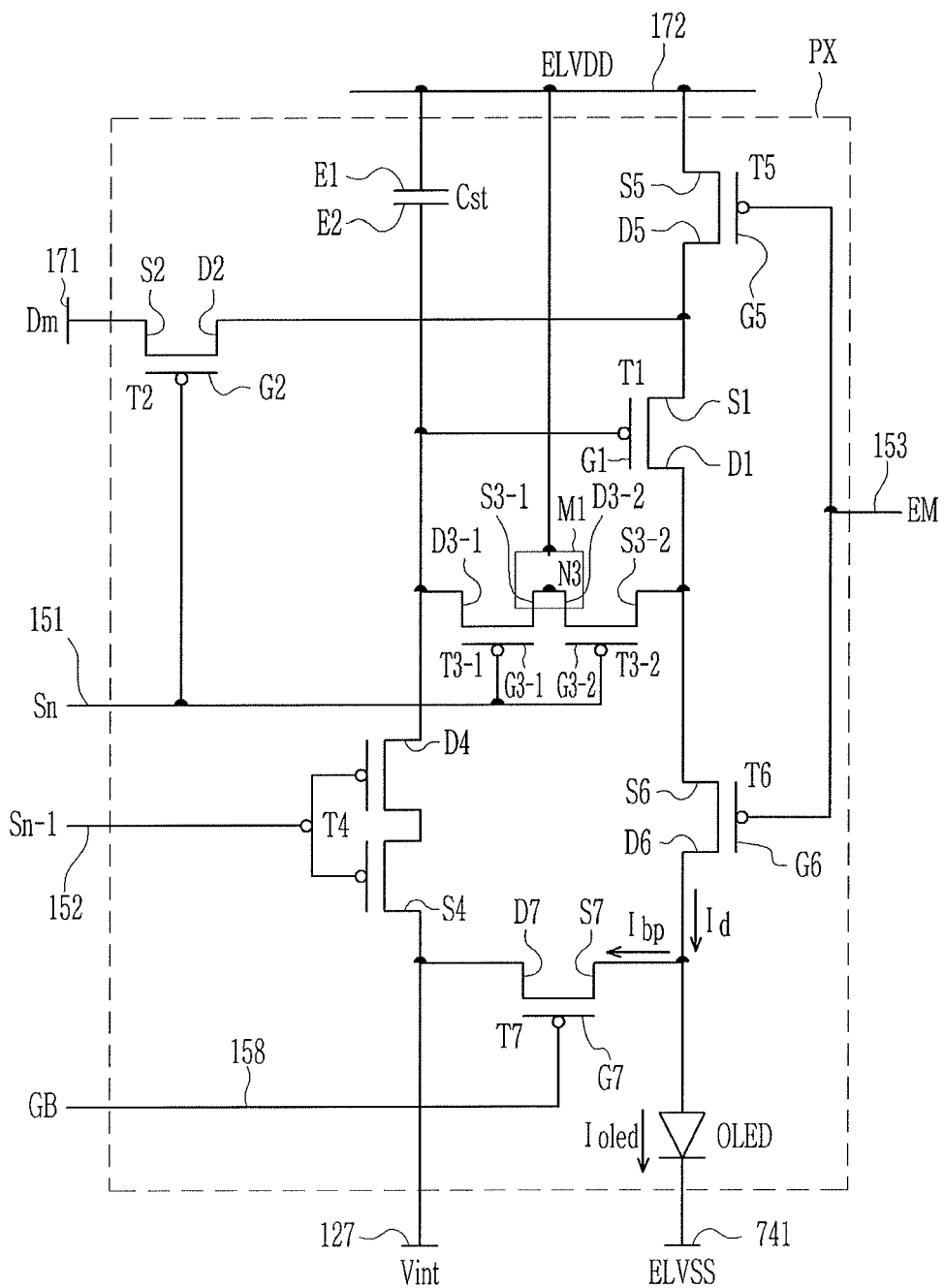
FIG. 13 illustrates an equivalent circuit diagram of one pixel of an organic light emitting diode display according to an example embodiment.

FIG. 13 illustrates an equivalent circuit diagram of one pixel of an organic light emitting diode display according to an example embodiment.

FIG. 13 generally corresponds to FIG. 1 except that the overlapping layer M1 is electrically connected to the driving voltage line 172 to which the driving voltage ELVDD is applied.

In the present example embodiment, referring to FIG. 13, when the driving voltage ELVDD is applied to the overlapping layer M1, a voltage at one end of the additional storage capacitor is fixed so that the characteristic of the additional storage capacitor becomes constant, thus the third node N3 of the third transistor T3 overlapping the overlapping layer M1 may be further stabilized.

In the present example embodiment, the threshold voltage Vth of the third transistor T3 is shifted in a negative direction by a high voltage such as the driving voltage ELVDD applied to the overlapping layer M1. When the threshold voltage Vth of the third transistor T3 is shifted in the negative direction, the kickback voltage of the third transistor T3 using a p-type semiconductor is further reduced, so that luminance reduction is reduced.

The example embodiment of FIG. 13 is the same as that of FIG. 1 in that it operates while the signal of FIG. 2 is applied as in the present example embodiment of FIG. 1.

In the present example embodiment, the example embodiment of FIG. 13 may also be applied to the case where the semiconductor layer around the third transistor T3 has various structures as in the example embodiments of FIG. 3 to FIG. 12. Thus, the capacitance portion may protrude or may not protrude, or may be disposed to be spaced apart from the semiconductor layer by a predetermined distance.

In the present example embodiment, the driving voltage ELVDD is applied to the overlapping layer M1.

Hereinafter, a structure in which the driving voltage ELVDD is applied to the overlapping layer M1 will be described with reference to FIG. 14 and FIG. 15. Herein, an example embodiment having a semiconductor layer structure corresponding to FIG. 3 among structures of various semiconductor layers is used as a representative. The example embodiment in which the driving voltage ELVDD is applied to the overlapping layer M1 may also be applied to FIG. 6, FIG. 8, FIG. 10, or FIG. 12.

Figure 14:
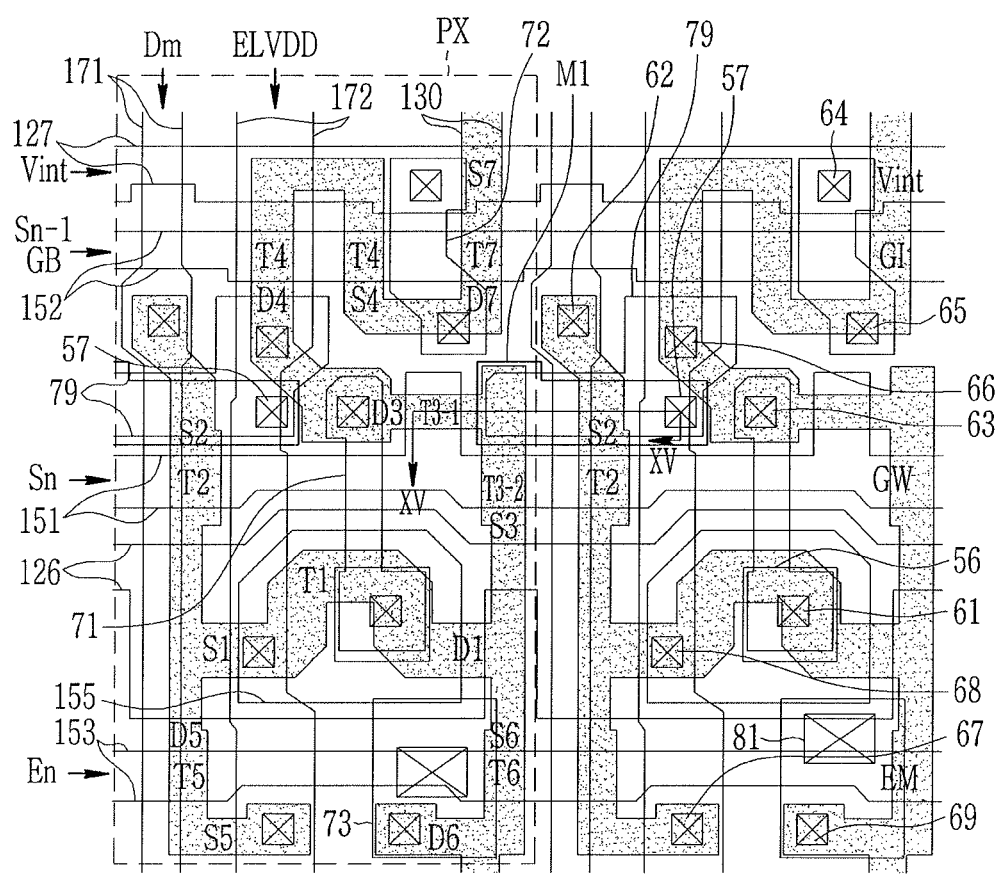
FIG. 14 illustrates a layout view of one pixel area of an organic light emitting diode display according to an example embodiment.
Figure 15:
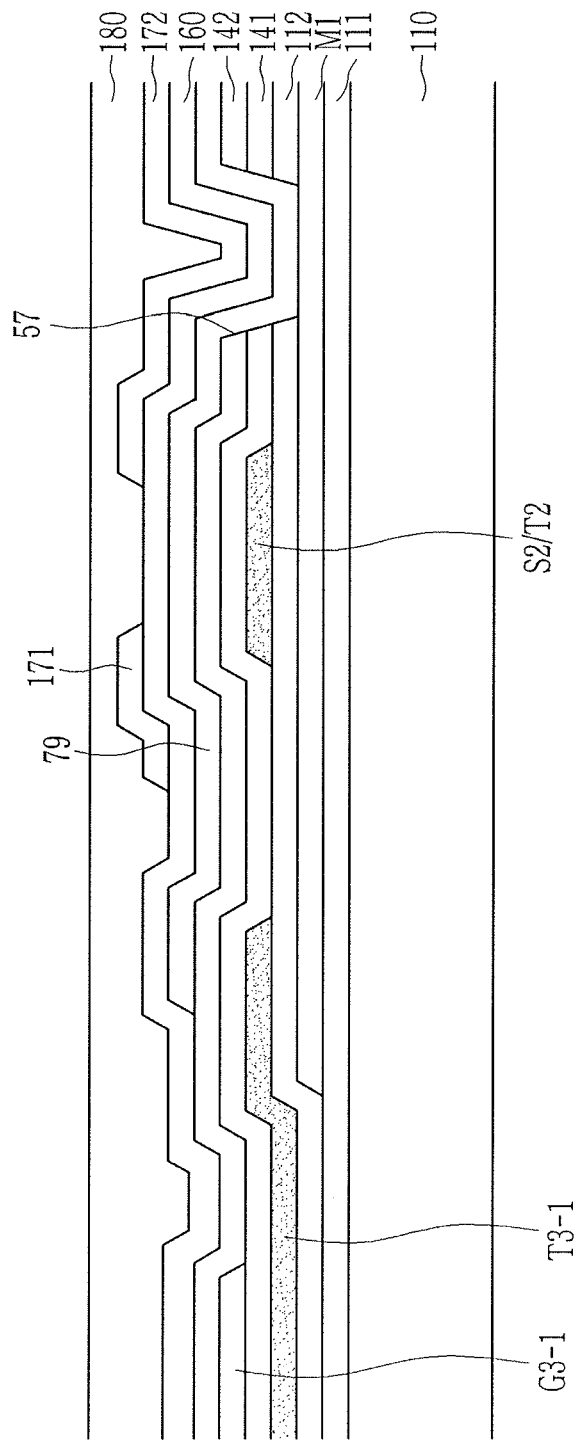
FIG. 15 illustrates a cross-sectional view taken along line XV-XV of FIG. 14.

FIG. 14 illustrates a layout view of one pixel area of an organic light emitting diode display according to an example embodiment, and FIG. 15 illustrates a cross-sectional view taken along line XV-XV of FIG. 14.

In the present example embodiment, referring to FIG. 14, the overlapping layer M1 is formed of a metal having a conductive characteristic or a semiconductor material corresponding to the metal, and is disposed between a substrate 110 (which may be flexible and which may be formed of plastic or polyimide (PI)) and a semiconductor layer. In the present example embodiment, the overlapping layer M1 overlaps the third node at which two transistors T3-1 and T3-2 are connected in the third transistor T3 in a plan view, and may overlap at least some of other portions of the two transistors T3-1 and T3-2.

In the present example embodiment of FIG. 14, the semiconductor layer overlapping the overlapping layer M1 further includes the capacitance portion, and protrudes upward as shown in FIG. 3.

In the present example embodiment, the semiconductor layer ACTIVE disposed around the third transistor T3 extends in the first direction, passes the gate electrode G3-1 of the 3-1 transistor T3-1, is bent in the second direction, and then extends downward. The semiconductor layer ACTIVE has a structure (additional capacitance portion) protruding upward at a portion bent in the second direction. Accordingly, the additional capacitance portion has a larger width than that of the semiconductor layer ACTIVE extending in the first direction. (See arrows of FIG. 4) In FIG. 14, the portion at which the semiconductor layer ACTIVE is bent corresponds to the third node N3 to which the 3-1 transistor T3-1 and the 3-2 transistor T3-2 are connected. Therefore, the additional capacitance portion is disposed in the vicinity of the third node N3.

In the present example embodiment, the portion where the semiconductor layer ACTIVE is bent and the additional capacitance portion overlap the overlapping layer M1 to form the additional storage capacitor.

In the present example embodiment, the overlapping layer M1 is electrically connected to the parasitic capacitor control pattern 79 that is electrically connected to the driving voltage line 172 through the opening 66, through an opening 57, and receives the driving voltage ELVDD.

A connection structure of the overlapping layer M1 and the parasitic capacitor control pattern 79 is shown in detail in FIG. 15.

The organic light emitting diode display shown in FIG. 15 uses the substrate 110 formed of a flexible material such as plastic or polyimide (PI). The barrier layer 111 is disposed on the substrate 110, and the overlapping layer M1 formed of a conductive metal or a semiconductor material having the same conductive property is disposed on the barrier layer 111.

The buffer layer 112 is disposed on the overlapping layer M1. The barrier layer 111 and the buffer layer 112 may include an inorganic insulating material such as a silicon oxide, a silicon nitride, and an aluminum oxide, and may also include an organic insulating material such as polyimide and polyacryl (for example, to which epoxy is added).

In the present example embodiment, the semiconductor layer 130 including the channels, the first electrodes, and the second electrodes of the plurality of transistors T1, T2, T3, T4, 15, T6, and T7 is disposed on the buffer layer 112. In FIG. 15, only the semiconductor layer 130 corresponding to some of the third transistor T3 is shown in a cross-sectional position view.

In the present example embodiment, the first gate insulating layer 141 covering the semiconductor layer 130 is disposed on the semiconductor layer 130.

In the present example embodiment, the first gate conductor, which includes the gate electrodes (the second storage electrodes E2) of the plurality of transistors T1, T2, T3, T4, 15, T6, and T7, the scan line 151, the front scan line 152, and the light emission control line 153, is disposed on the first gate insulating layer 141. In FIG. 15, one of the gate electrodes G3-1 of the third transistor T3 is shown in a cross-sectional position view.

In the present example embodiment, the second gate insulating layer 142 covering the first gate conductor is disposed on the first gate conductor. The first gate insulating layer 141 and the second gate insulating layer 142 may be formed of a material such as a silicon nitride, a silicon oxide, and an aluminum oxide.

In the present example embodiment, the second gate conductor, which includes the storage line 126, the first storage electrode E1, the initialization voltage line 127, and the parasitic capacitor control pattern 79, is disposed on the second gate insulating layer 142.

In the present example embodiment, the opening 57 is formed in the buffer layer 112, the first gate insulating layer 141, and the second gate insulating layer 142 to expose some of the overlapping layer M1. The parasitic capacitor control pattern 79 is electrically connected to the overlapping layer M1 through the opening 57. The parasitic capacitor control pattern 79 is electrically connected to the driving voltage line 172 through the opening 66. Thus, the overlapping layer M1 is also electrically connected to the driving voltage line 172. Accordingly, the driving voltage ELVDD is applied to the overlapping layer M1. In an example embodiment, the overlapping layer M1 may be directly connected to the driving voltage line 172.

In the present example embodiment, the interlayer insulating layer 160 covering the second gate conductor is disposed on the second gate conductor. The interlayer insulating layer 160 may be formed of a material such as a silicon nitride, a silicon oxide, and an aluminum oxide, and may also be formed of an organic insulating material.

In the present example embodiment, the data conductor, which includes the data line 171, the driving voltage line 172, the first data connecting member 71, the second data connecting member 72, and the third data connecting member 73, is disposed on the interlayer insulating layer 160.

The passivation layer 180 covering the data conductor is disposed on the data conductor. The passivation layer 180, which also is referred to as a planarizing layer, may include an organic insulating material.

In the present example embodiment, a pixel electrode, an organic light emitting layer, a partition wall, and a common electrode may be formed on the passivation layer 180.

Referring to FIG. 14, in order to receive the driving voltage ELVDD, the overlapping layer M1 may further include an extension for connection in addition to a portion (overlap portion) overlapping the third node. In an example embodiment, a length of the extension may be shorter.

In the present example embodiment, referring to FIG. 14, the overlap portion of the overlapping layer M1 is formed to be large enough to entirely overlap the portion where the semiconductor layer ACTIVE is bent and the additional capacitance portion in a plan view. Accordingly, an area in which the overlapping layer M1 overlaps the semiconductor layer ACTIVE (including the additional capacitance portion) increases, and as a result, the capacitance of the additional storage capacitor increases. The voltage variation at the third node N3 is reduced by the additional storage capacitor, so that the kickback voltage of the third transistor T3 is also reduced.

In the present example embodiment, in the structure of FIG. 14 and FIG. 15, the overlapping layer M1 and the parasitic capacitor control pattern 79 exist as layers overlapping the third node, and the driving voltage ELVDD is applied to both of them. In another implementation, different voltages may be applied to them.

In the above description, the structure in which the overlapping layer M1 receives the driving voltage ELVDD and the additional capacitance portion is provided in the semiconductor layer has been described.

Hereinafter, an example embodiment in which the overlapping layer M1 receives the driving voltage ELVDD but no capacitance portion is provided in the semiconductor layer will be described with reference to FIG. 16.

Figure 16:
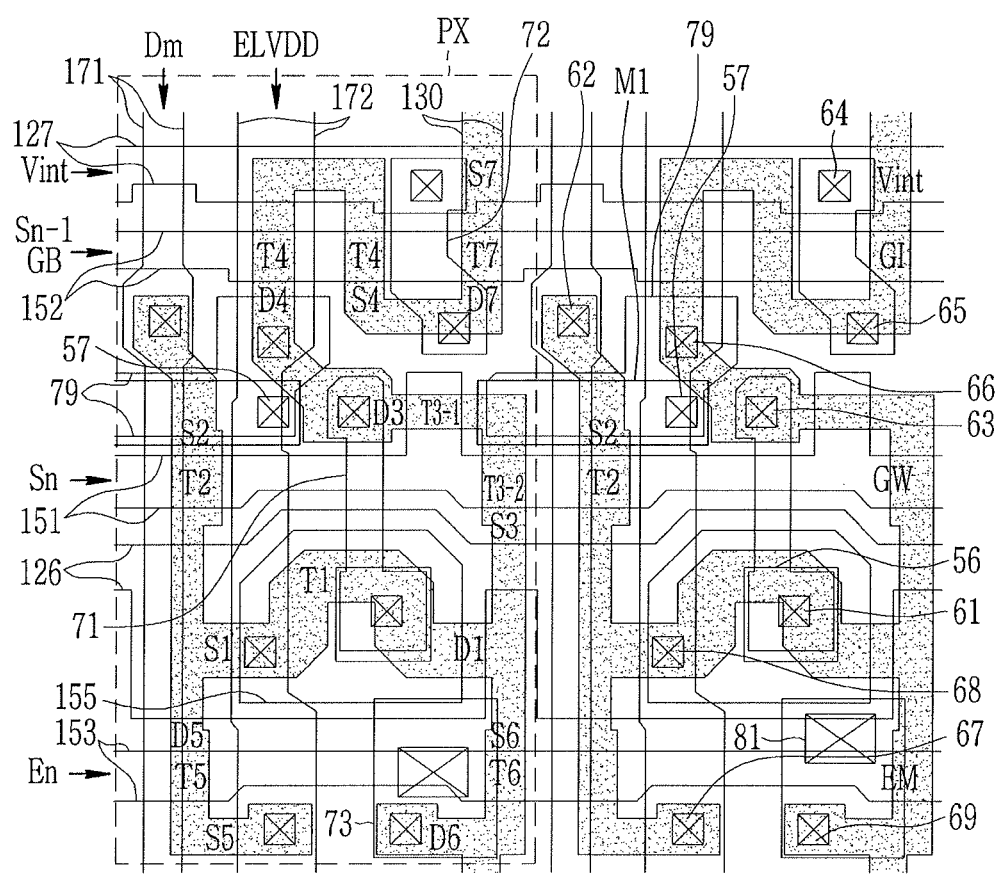
FIG. 16 illustrates a layout view of one pixel area of an organic light emitting diode display according to an example embodiment.

FIG. 16 illustrates a layout view of one pixel area of an organic light emitting diode display according to an example embodiment.

In the present example embodiment, referring to FIG. 16, the overlapping layer M1 is formed of a metal having a conductive characteristic or a semiconductor material corresponding to the metal, and is disposed between a substrate 110 (which may be flexible and which may be formed of plastic or polyimide (PI)) and a semiconductor layer. In the present example embodiment, the overlapping layer M1 overlaps the third node at which two transistors T3-1 and T3-2 are connected in the third transistor T3 in a plan view, and may overlap at least some of other portions of the two transistors T3-1 and T3-2.

In the present example embodiment of FIG. 16, the semiconductor layer overlapping the overlapping layer M1 does not include the additional capacitance portion. Thus, the semiconductor layer ACTIVE disposed around the third transistor T3 extends in the first direction, passes the gate electrode G3-1 of the 3-1 transistor T3-1, is bent in the second direction, and then extends downward. Here, the portion at which the semiconductor layer ACTIVE is bent corresponds to the third node N3 to which the 3-1 transistor T3-1 and the 3-2 transistor T3-2 are connected. Therefore, the additional capacitance portion is disposed in the vicinity of the third node N3.

The portion at which the semiconductor layer ACTIVE is bent overlaps the overlapping layer M1 to form the additional storage capacitor.

In the present example embodiment, the overlapping layer M1 is electrically connected to the parasitic capacitor control pattern 79 that is electrically connected to the driving voltage line 172 through the opening 66, through the opening 57, and receives the driving voltage ELVDD.

In the present example embodiment, in the structure of FIG. 16, the overlapping layer M1 and the parasitic capacitor control pattern 79 exist as layers overlapping the third node, and the driving voltage ELVDD is applied to both of them. In another implementation, different voltages may be applied to them.

The cross-sectional view in connection with the present example embodiment of FIG. 16 is the same as FIG. 15. Thus, in the present example embodiment of FIG. 16, the connection structure of the overlapping layer M1 and the parasitic capacitor control pattern 79 may be as in FIG. 15.

In the present example embodiment, referring to FIG. 16, in order to receive the driving voltage ELVDD, the overlapping layer M1 may further include an extension for connection in addition to a portion (overlap portion) overlapping the third node. In an example embodiment, a length of the extension may be shorter.

In the present example embodiment of FIG. 16, the additional capacitance portion of the semiconductor layer may not be included therein, as in FIG. 12. For example, the variation at the kickback voltage of the third transistor T3 may be sufficiently reduced by the capacitance additionally formed by the overlapping of the portion at which the semiconductor layer ACTIVE is bent and the overlapping layer M1.

In the above description, the case in which the overlapping layer M1 is disposed between the substrate 110 and the semiconductor layer has been mainly described. In another implementation, the overlapping layer M1 may not be disposed between the semiconductor layer ACTIVE and the substrate 110, but may be disposed above the semiconductor layer ACTIVE and may be formed of one of the first gate conductor, the second gate conductor, and the data conductor.

FIG. 14 to FIG. 16 illustrate the structure in which the overlapping layer M1 is applied with the driving voltage ELVDD through the opening 57 of the pixel next thereto, but the opening 57 may be disposed in the pixel.

Hereinafter, an example embodiment in which the overlapping layer M1 is formed of the second gate conductor will be described with reference to FIG. 17 and FIG. 18.

Figure 17:
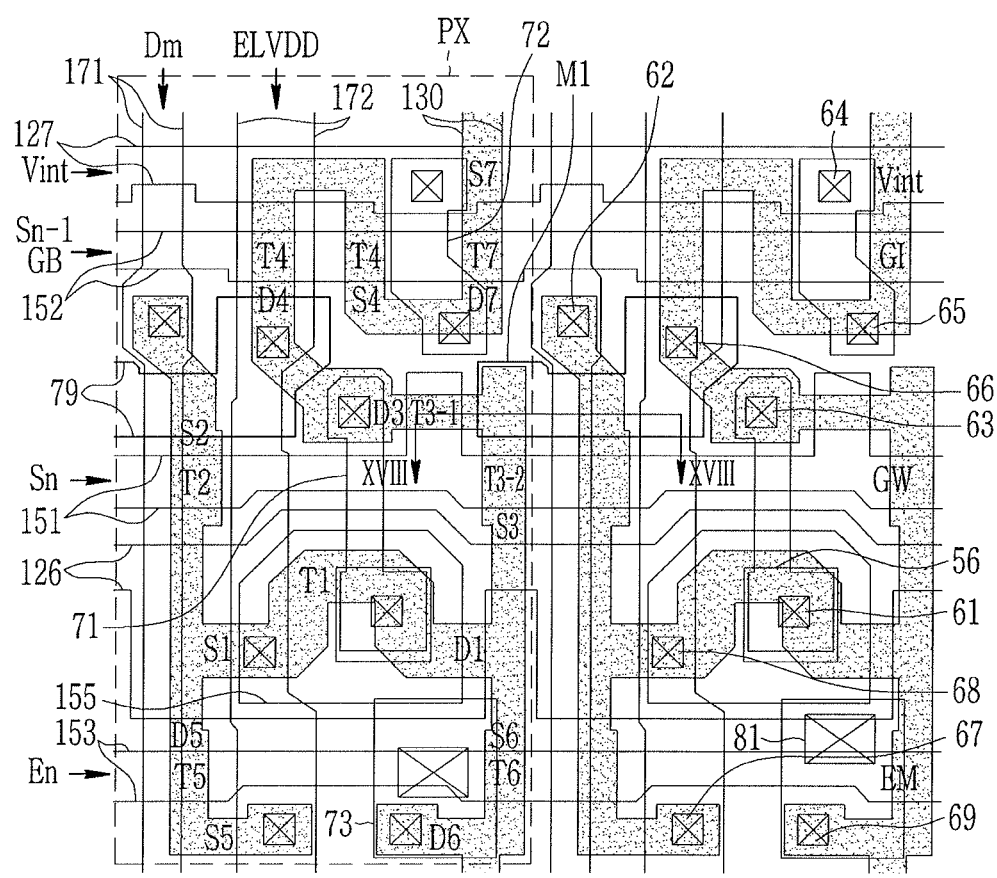
FIG. 17 illustrates a layout view of one pixel area of an organic light emitting diode display according to an example embodiment.
Figure 18:
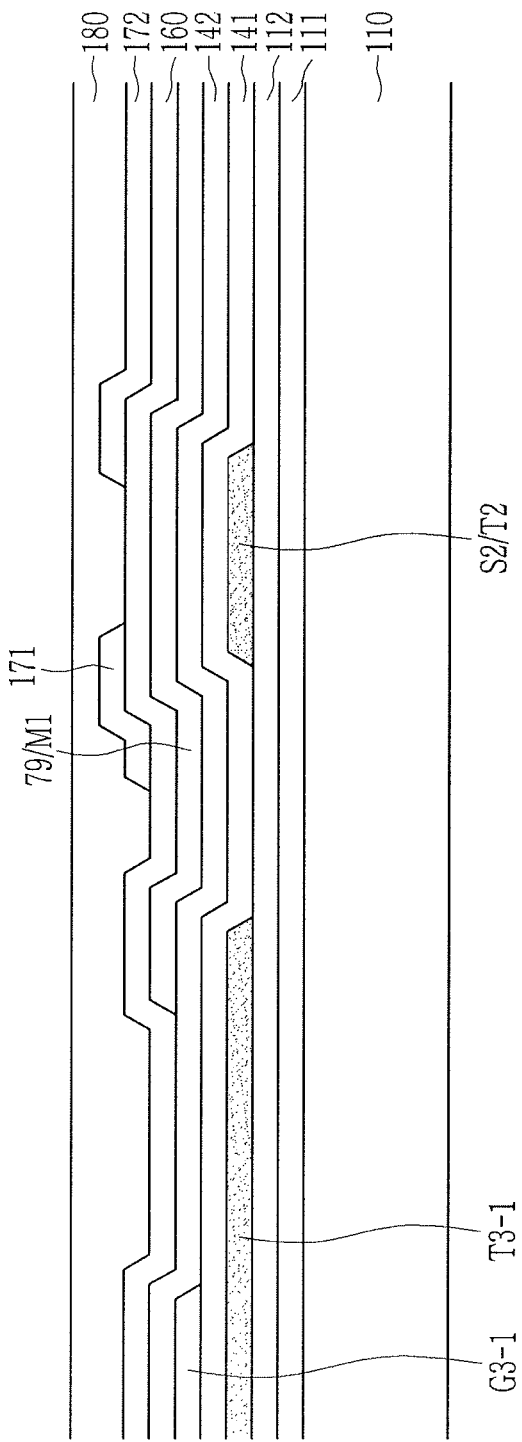
FIG. 18 illustrates a cross-sectional view taken along line XVIII-XVIII of FIG. 17.

In the present example embodiment, in FIG. 17 and FIG. 18, the overlapping layer M1 overlaps with the parasitic capacitor control pattern 79 and is integrally formed therewith.

FIG. 17 illustrates a layout view of one pixel area of an organic light emitting diode display according to an example embodiment, and FIG. 18 illustrates a cross-sectional view taken along line XVIII-XVIII of FIG. 17.

In the present example embodiment, the organic light emitting diode display shown in FIG. 17 and FIG. 18 uses the substrate 110, which may be flexible and may be formed of a flexible material such as plastic or polyimide (PI). The barrier layer 111 is disposed on the substrate 110, and the buffer layer 112 is disposed on the barrier layer 111. The barrier layer 111 and the buffer layer 112 may include an inorganic insulating material such as a silicon oxide, a silicon nitride, and an aluminum oxide, and may also include an organic insulating material such as polyimide and polyacryl (for example, to which epoxy is added).

In the present example embodiment, the semiconductor layer 130 including the channels, the first electrodes, and the second electrodes of the plurality of transistors T1, T2, T3, T4, T5, T6, and T7 is disposed on the buffer layer 112. The first gate insulating layer 141 covering the semiconductor layer 130 is disposed on the semiconductor layer 130.

In the present example embodiment, the first gate conductor, which includes the gate electrodes (the second storage electrodes E2) of the plurality of transistors T1, T2, T3, T4, T5, T6, and T7, the scan line 151, the front scan line 152, and the light emission control line 153, is disposed on the first gate insulating layer 141.

In the present example embodiment, the second gate insulating layer 142 covering the first gate conductor is disposed on the first gate conductor. The first gate insulating layer 141 and the second gate insulating layer 142 may be formed of a material such as a silicon nitride, a silicon oxide, and an aluminum oxide.

In the present example embodiment, the second gate conductor including the storage line 126, the first storage electrode E1, and the initialization voltage line 127 is disposed on the second gate insulating layer 142. The overlapping layer M1 integrally formed with the parasitic capacitor control pattern 79 is disposed on the second gate insulating layer 142. The parasitic capacitor control pattern 79 is electrically connected to the driving voltage line 172 through the opening 66. Thus, the overlapping layer M1 integrally formed therewith is applied with the driving voltage ELVDD.

In the present example embodiment, the interlayer insulating layer 160 covering on the second gate conductor is disposed on the second gate conductor. The interlayer insulating layer 160 may be formed of a material such as a silicon nitride, a silicon oxide, and an aluminum oxide, and may also be formed of an organic insulating material.

In the present example embodiment, the data conductor, which includes the data line 171, the driving voltage line 172, the first data connecting member 71, the second data connecting member 72, and the third data connecting member 73, is disposed on the interlayer insulating layer 160.

In the present example embodiment, the passivation layer 180 covering the data conductor is disposed on the data conductor. The passivation layer 180, which also is referred to as a planarizing layer, may include an organic insulating material.

The pixel electrode, the organic light emitting layer, the partition wall, and the common electrode may be formed on the passivation layer 180.

FIG. 17 and FIG. 18 illustrate the present example embodiment in which the overlapping layer M1 is formed of the second gate conductor, and receives the driving voltage ELVDD. The overlapping layer M1 disposed between the semiconductor layer and the substrate is removed, and it is integrally formed with the parasitic capacitor control pattern 79.

In an example embodiment, the overlapping layer M1 may be formed of the first gate conductor or the data conductor.

In the present example embodiment of FIG. 17 and FIG. 18, the additional capacitance portion protruding upward as shown in FIG. 3 is used. However, the capacitance portion may protrude differently, or there may be no additional capacitance portion, or the capacitance portion may be spaced apart from the semiconductor layer by a predetermined distance.

In the example embodiments of FIG. 13 to FIG. 18, only the driving voltage ELVDD is described as the voltage applied to the overlapping layer M1 but other voltages may be applied thereto, for example, the initialization voltage Vint, the common voltage ELVSS, the scan signal Sn, the front scan signal Sn−1, the data voltage Dm, or the light emission control signal EM, and they may be connected to one terminal of the plurality of transistors T1-T7 or one terminal of the organic light emitting element. The threshold voltage Vth of the channel of the transistor that overlaps the overlapping layer M1 may be shifted according to a voltage applied to the overlapping layer M1. When the applied voltage is the driving voltage ELVDD and when the applied voltage is the initialization voltage Vint, the threshold voltage Vth of the transistor may be shifted in the opposite direction. Therefore, it is possible to compensate the transistor by applying various voltages to the overlapping layer M1 in accordance with the characteristic of the transistor to be compensated by using such a characteristic. In the present example embodiment, the voltage applied to the overlapping layer M1 may be determined in consideration of whether the channel of the transistor is a p-type or n-type.

Further, various other modified embodiments are possible, and hereinafter, another modified embodiment will be described with reference to FIG. 19 to FIG. 21.

An example embodiment shown in FIG. 19 and FIG. 20 will now be described.

Figure 19:
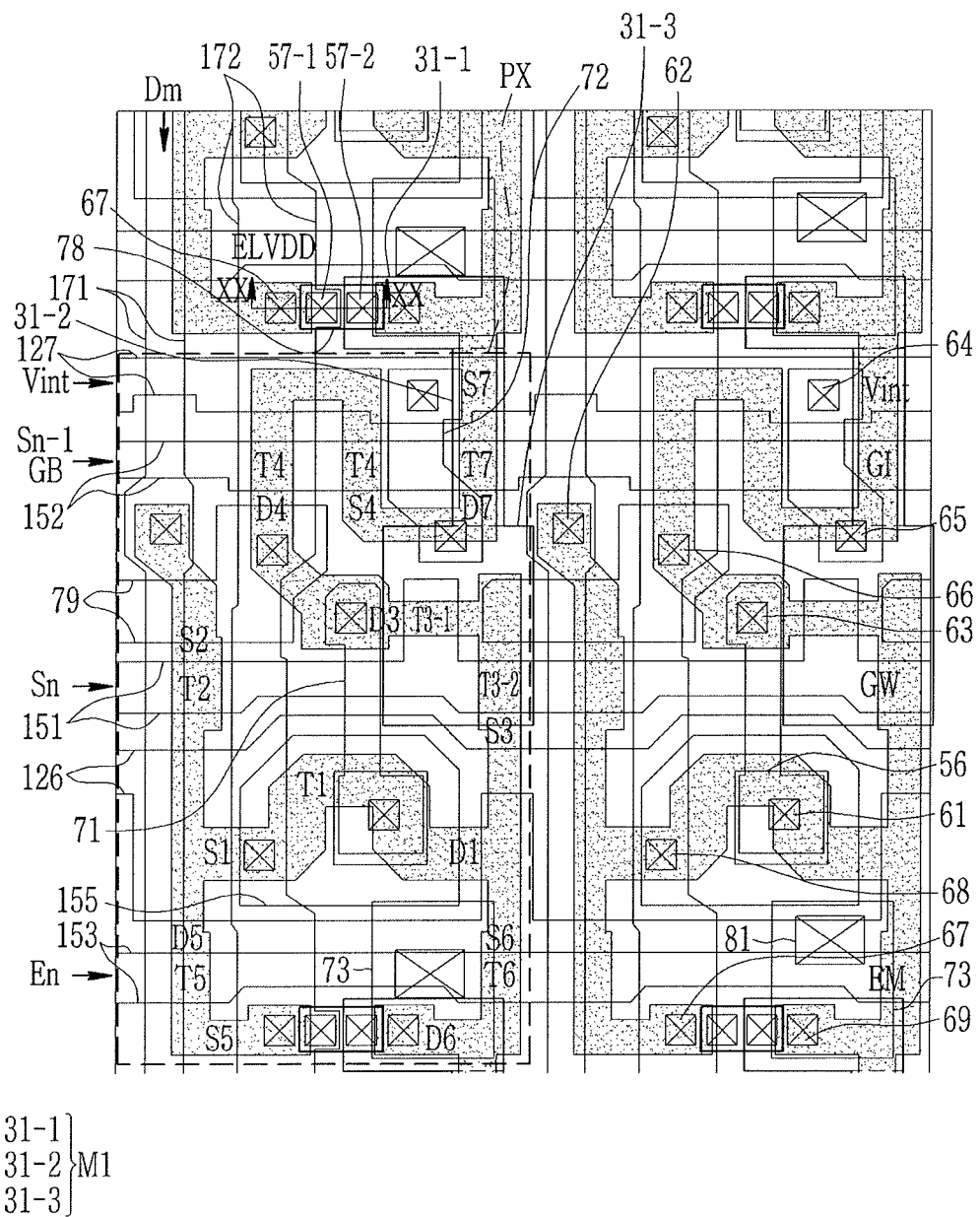
FIG. 19 illustrates a layout view of one pixel area of an organic light emitting diode display according to an example embodiment.
Figure 20:
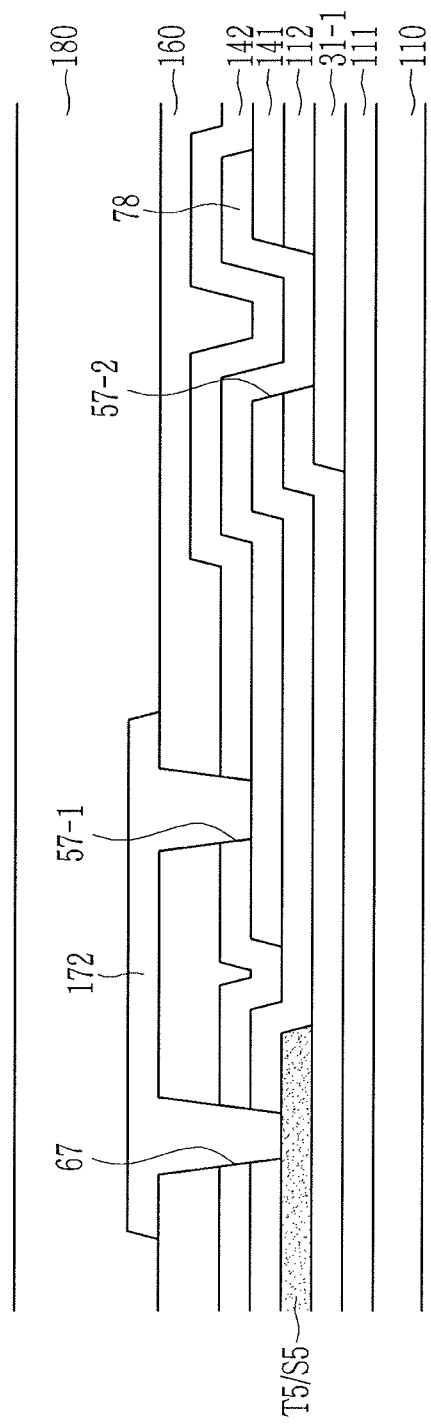
FIG. 20 illustrates a cross-sectional view taken along line XX-XX of FIG. 19.

FIG. 19 illustrates a layout view of one pixel area of an organic light emitting diode display according to an example embodiment, and FIG. 20 illustrates a cross-sectional view taken along line XX-XX of FIG. 19.

The example embodiment of FIG. 19 and FIG. 20 is the same as the example embodiments of FIG. 14 to FIG. 18 in that the overlapping layer M1 is applied with the driving voltage ELVDD, but there is a difference between them in that the opening of the present example embodiment of FIG. 19 and FIG. 20 receiving the driving voltage ELVDD is not disposed in an adjacent pixel but is disposed in an upper pixel.

The example embodiment shown in FIG. 19 and FIG. 20 will now be described in detail.

The overlapping layer M1 according to the present example embodiment shown in FIG. 19 and FIG. 20 is disposed between the substrate 110 and the semiconductor layer as shown in FIG. 14 to FIG. 17. Thus, the overlapping layer M1 is disposed between a substrate 110 (which may be flexible and which may be formed of plastic or polyimide (PI)) and a semiconductor layer, and is formed of a metal having a conductive characteristic or a semiconductor material corresponding to the metal.

In the present example embodiment, the overlapping layer M1 is applied with the driving voltage ELVDD, and for example, it is applied with the driving voltage ELVDD through an opening 57-2 disposed in the upper pixel.

In the present example embodiment, the overlapping layer M1 overlaps the third node at which two transistors T3-1 and T3-2 are connected in the third transistor T3 in a plan view, and may overlap at least some of other portions of the two transistors T3-1 and T3-2. The third node at which the two transistors T3-1 and T3-2 are connected further includes the additional capacitance portion, and the capacitance portion according to the present example embodiment of FIG. 19 and FIG. 20 upwardly protrudes.

In the present example embodiment, the portion where the semiconductor layer ACTIVE is bent and the additional capacitance portion overlap the overlapping layer M1 to form the additional storage capacitor. The overlapping layer M1 is formed to be large enough to entirely overlap the portion where the semiconductor layer ACTIVE is bent and the additional capacitance portion in a plan view. Thus, an area in which the overlapping layer M1 overlaps the semiconductor layer ACTIVE (including the additional capacitance portion) increases, and as a result, the capacitance of the additional storage capacitor increases.

In the present example embodiment, as shown in FIG. 19 and FIG. 20, when the driving voltage ELVDD is applied to the overlapping layer M1, a voltage at one end of the additional storage capacitor is fixed so that the characteristic of the additional storage capacitor becomes constant, thus the third node N3 of the third transistor T3 overlapping the overlapping layer M1 may be further stabilized. The threshold voltage Vth of the third transistor T3 is shifted in a negative direction because a high voltage such as the driving voltage ELVDD is applied to the overlapping layer M1. When the threshold voltage Vth of the third transistor T3 is shifted in the negative direction, the kickback voltage of the third transistor T3 using a p-type semiconductor is further reduced, so that luminance reduction is reduced.

Hereinafter, as shown in FIG. 19 and FIG. 20, a structure in which the overlapping layer M1 is electrically applied with the driving voltage ELVDD through the opening 57-2 disposed in the upper pixel will be described in detail.

For reference, in FIG. 19, the overlapping layer M1 is illustrated with a thicker line than those of other parts in order to more clearly show the structure of the overlapping layer M1.

The overlapping layer M1 according to the present example embodiment of FIG. 19 and FIG. 20 includes an extension portion 31-3 overlapping the third node N3 of the third transistor T3 in a plan view, a contact portion 31-1 receiving the driving voltage ELVDD, and a connecting portion 31-2 for connecting the extension portion 31-3 and the contact portion 31-1. In FIG. 19, the overlapping layer M1 is bent to be connected to the driving voltage line 172.

According to the present example embodiment of FIG. 19, the driving voltage line 172 also includes a protrusion laterally protruding to be connected to the contact portion 31-1 of the overlapping layer M1. The driving voltage line 172 and the overlapping layer M1 are electrically connected to each other through a connecting member 78.

In the present example embodiment, referring to FIG. 20, the protrusion of the driving voltage line 172 is connected to one end of the connecting member 78 formed by the second gate conductor through an opening 57-1. The other end of the connecting member 78 is connected to the contact portion 31-1 of the overlapping layer M1 through the opening 57-2, and receives the driving voltage ELVDD.

In the present example embodiment of FIG. 19 and FIG. 20, the connecting portion 31-2 of the overlapping layer M1 overlaps the seventh transistor T7. The portion (the contact portion 31-1) receiving the driving voltage ELVDD additionally overlaps the seventh transistor T7 while extending to the third node N3 of the third transistor T3. Such additionally overlapping structure may be omitted according to the characteristics of the pixel.

Figure 21:
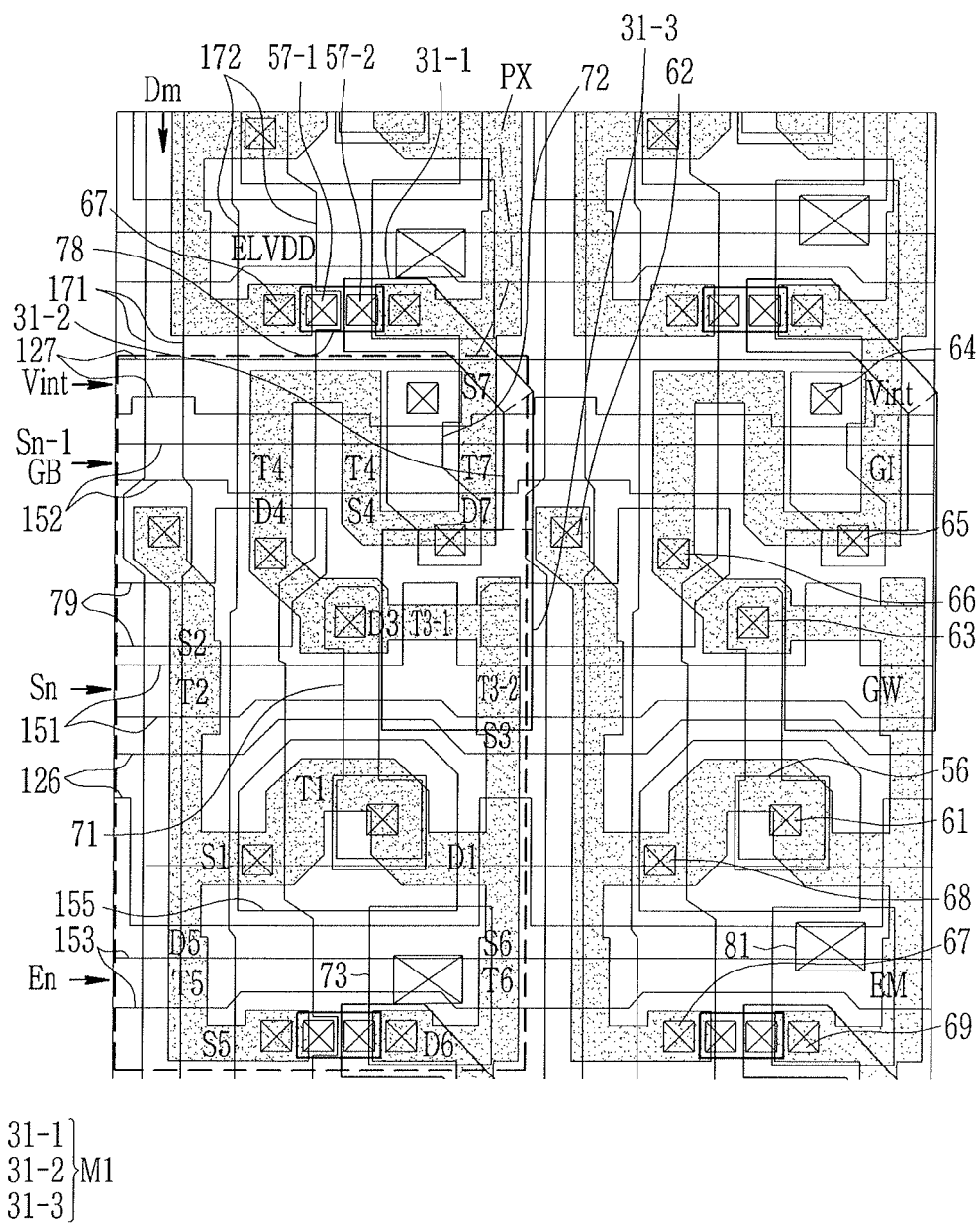
FIG. 21 illustrates a layout view of one pixel area of an organic light emitting diode display according to an example embodiment.

FIG. 21 illustrates a structure in which the portion (the contact portion 31-1) receiving the driving voltage ELVDD that additionally overlaps the seventh transistor T7 while extending to the third node N3 of the third transistor T3 is small.

FIG. 21 illustrates a layout view of one pixel area of an organic light emitting diode display according to an example embodiment.

According to the present example embodiment of FIG. 21, unlike that of FIG. 19, the connecting portion 31-2 of the overlapping layer M1 is formed along a periphery of the pixel to minimize overlap with other transistors.

In the present example embodiment of FIG. 21, the connecting portion 31-2 of the overlapping layer M1 is formed along a boundary line (indicated by a dotted line) of the pixel PX and does not overlap a channel region of the seventh transistor T7.

The example embodiment of FIG. 21 may have an advantage that undesired parasitic capacitance may be eliminated.

In an example embodiment, the overlapping layer M1 may not be disposed between the semiconductor layer ACTIVE and the substrate 110 but may be disposed on the semiconductor layer ACTIVE, and may be formed of one of the first gate conductor, the second gate conductor, and the data conductor. In addition, a voltage other than the driving voltage ELVDD may be applied to the overlapping layer M1. Further, the additional capacitance portion formed in the semiconductor layer ACTIVE may not protrude in an upper direction but may protrude in a lateral direction or in another direction. Further, there may be no additional capacitance portion, or the capacitance portion may be spaced apart from the semiconductor layer by a predetermined distance.

In FIG. 19 to FIG. 21, although the overlapping layer M1 is applied with the driving voltage ELVDD through the opening 57-2 of the pixel adjacent thereto, the opening 57-2 may be disposed in some of the pixel.

Hereinafter, effects according to an example embodiment will be described with reference to FIG. 22 and FIG. 23.

Figure 22:
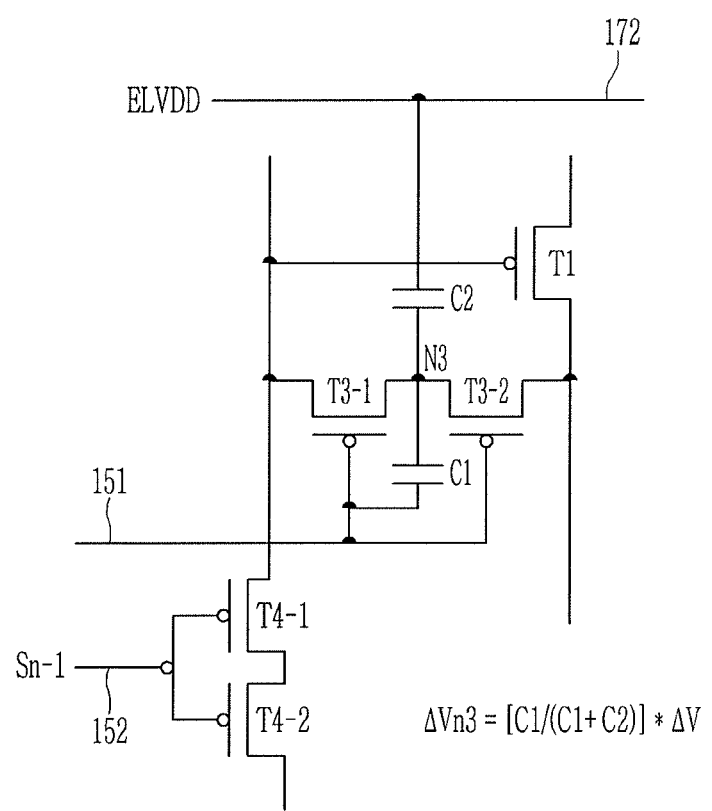
FIG. 22 illustrates some of the circuit diagram of FIG. 13.

FIG. 22 illustrates some of the circuit diagram of FIG. 13.

FIG. 22 illustrates an additional storage capacitor C2 and a parasitic capacitor C1 related to the third transistor T3.

In the present example embodiment, one end of the additional storage capacitor C2 is applied with the driving voltage ELVDD, and the other end thereof is an N2 node. One end of the parasitic capacitor C1 is the N2 node, and the other end thereof is a gate electrode of the third transistor T3. Although FIG. 22 illustrates the structure in which the other end of the parasitic capacitor C1 is only the gate electrode G3-1 of the 3-1 transistor T3-1, the other end of the parasitic capacitor C1 may include the gate electrode G3-2 of a 3-2 transistor T3-2.

In this structure, a variation (ΔVn3) of the kickback voltage of the third transistor T3 shown in FIG. 22 is represented by Equation 1.

$$\Delta Vn3 = [C1/(C1+C2)] \times \Delta V \qquad \text{[Equation 1]}$$

In Equation 1, C1 is a capacitance value of the parasitic capacitor C1, and C2 is a capacitance value of the additional storage capacitor C2.

The capacitance value of the parasitic capacitor C1 is a value that is determined when the structure of the third transistor T3 is determined, thus it is not varied. However, the capacitance value of the additional storage capacitor C2 varies depending on a size of the semiconductor layer overlapping the overlapping layer M1.

According to Equation 1, it can be seen that the variation (ΔVn3) of the kickback voltage of the third transistor T3 decreases as the C2 value increases. Therefore, it is possible to reduce a width of the variation (ΔVn3) of the kickback voltage of the third transistor T3 by increasing the capacitance value of the additional storage capacitor C2, and in an implementation, an additional capacitance portion may be provided in the semiconductor layer. Thus, according to an example embodiment, the variation (ΔVn3) of the kickback voltage of the third transistor T3 is reduced, thereby improving display quality.

Although FIG. 22 illustrates some of the circuit diagram of FIG. 13, since FIG. 13 illustrates the state in which only one electrode of the additional organic capacitor is floated, Equation 1 for the variation (ΔVn3) of the kickback voltage of the third transistor T3 is not different. Therefore, the same effect is also obtained in the present example embodiment in which the overlapping layer M1 is floated.

Hereinafter, various comparative examples (Ref) and the example embodiments will be used to compare a degree of luminance reduction with reference to FIG. 23.

Figure 23:
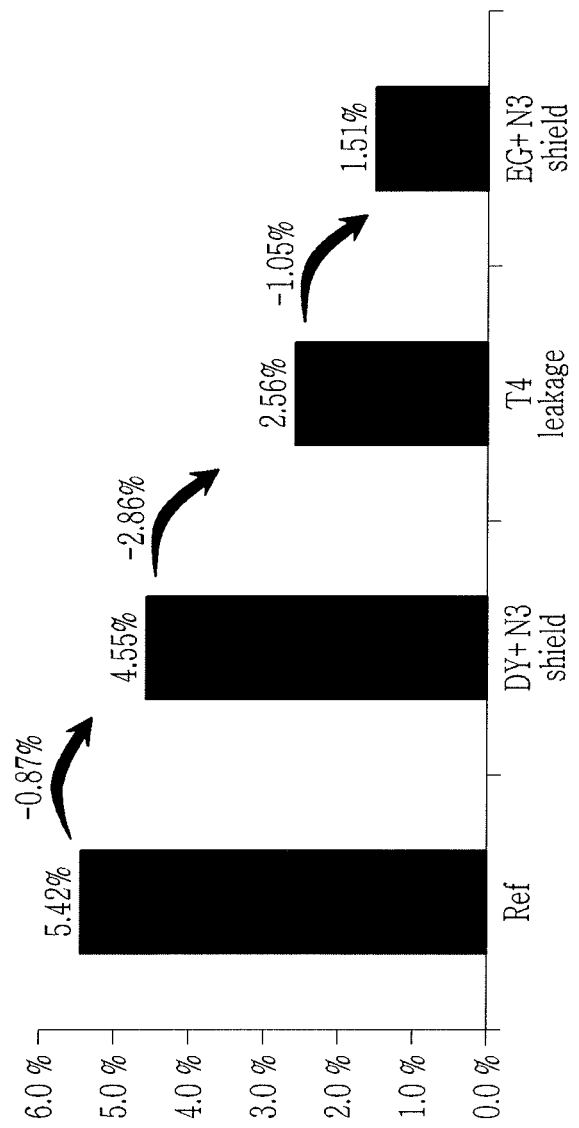
FIG. 23 illustrates experimental results of luminance reduction.

FIG. 23 illustrates experimental results of luminance reduction.

In FIG. 23, the degree of luminance reduction in two comparative examples (Ref and T4 leakage) and two example embodiments (DY+N3 shield and EG+N3 shield) is compared.

Comparative Example 1 (Ref) has a structure in which there is no layer overlapping the third transistor T3, and not only the overlapping layer M1 but also the parasitic capacitor control pattern 79 are formed. In Comparative Example 1 (Ref), although the third transistor T3 is formed of two transistors connected in series, the fourth transistor T4 is formed of one transistor and is not formed of two transistors connected in series.

In Comparative Example 2 (T4 leakage), the fourth transistor T4 of Comparative Example 1 (Ref) is also formed of two transistors connected in series to each other, and a channel length of the third transistor T3 and a channel length of the fourth transistor T4 are equal to each other. This is a case where only a leakage current in the third transistor T3 and the fourth transistor T4 is reduced.

Example Embodiment 1 (DY+N3 shield) further includes a layer overlapping the third transistor T3 in Comparative Example 1 (Ref), wherein the overlapping layer M1 and the parasitic capacitor control pattern 79 are formed.

Example Embodiment 2 (EG+N3 shield) further includes a layer overlapping the third transistor T3 in Comparative Example 2 (T4 leakage), wherein the overlapping layer M1 and the parasitic capacitor control pattern 79 are formed.

As shown in FIG. 23, it can be confirmed that the luminance reduction is reduced by including the layer overlapping the third transistor T3. In addition, it can be seen that the luminance reduction effect is further enhanced by reducing the leakage current of the third transistor T3 and the fourth transistor T4. In an implementation, the third transistor T3 and the fourth transistor T4 may include two transistors connected in series to each other.

By way of summation and review, generally, an organic light emitting diode display includes a substrate, a plurality of thin film transistors disposed on the substrate, a plurality of insulating layers disposed between wires for configuring the thin film transistors, and an organic light emitting element connected to the thin film transistor. A flexible organic light emitting diode display including a flexible substrate containing a polymer material as a substrate and capable of being entirely bent has been developed. The organic light emitting diode display includes a plurality of pixels, and a plurality of transistors included in each pixel may include a polycrystalline semiconductor or an oxide semiconductor.

As described above, embodiments relate to a flexible organic light emitting diode display. Embodiments may provide a flexible organic light emitting diode display in which, even if a transistor is formed on a flexible substrate, variation of a kickback voltage of the transistor may be reduced and display quality may not be degraded. Embodiments may provide an organic light emitting diode display that may improve display quality thereof by preventing an afterimage from being left when alternately displaying white and black by increasing storage capacitance of a specific transistor to reduce variation of a characteristic (for example, a kickback voltage) of a corresponding transistor.

<Description of symbols>

| | |
|---|---|
| 110: substrate | 111: barrier layer |
| M1: overlapping layer | 112: buffer layer |
| 130: semiconductor layer | 141: first gate insulating layer |
| 142: the second gate insulating layer | 160: interlayer insulating layer |
| 180: passivation layer | N3: third node |
| 56: opening | 57, 61-69, 81: opening |
| A1, A2: capacitance portion | 79: parasitic capacitor control pattern |
| 126: storage line | 127: initialization voltage line |
| 151: scan line | 152: front scan line |
| 153: light emission control line | 155: gate electrode |
| 158: bypass control line | 171: data line |
| 172: driving voltage line | 71, 72, 73: data connecting member |
| 741: common voltage line | E1, E2: storage electrode |
| 78: connecting member | 31-1: contact portion |
| 31-2: connecting portion | 31-3: extension portion |
| T1, T2, T3, T4, T5, T6, T7: transistor | |

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode display, comprising:
a substrate;
a conductive layer disposed on the substrate; and
a semiconductor layer on the substrate and the conductive layer, the semiconductor layer including a channel, a first electrode, and a second electrode for each of a plurality of transistors, the plurality of transistors including:
   a first transistor having a gate electrode, an input electrode, and an output electrode;
   a second transistor that is connected to a scan line, a data line, and the input electrode of the first transistor; and
   a third transistor including a gate electrode connected to the scan line, a first electrode connected to the output electrode of the first transistor, and a second electrode connected to the gate electrode of the first transistor, the third transistor including two transistors connected at a third node in the semiconductor layer, wherein
the conductive layer overlaps the third node and the first transistor in plan view.

2. The organic light emitting diode display as claimed in claim 1, wherein the semiconductor layer extends in a first direction within the third transistor, is bent at a bent portion in a second direction, and then extends in the second direction.

3. The organic light emitting diode display as claimed in claim 2, wherein the third node is disposed at the bent portion of the semiconductor layer.

4. The organic light emitting diode display as claimed in claim 3, wherein:
the semiconductor layer further comprises a protruding portion protruding in an upper direction at the bent portion, and
the conductive layer overlaps the protruding portion of the semiconductor layer in plan view.

5. The organic light emitting diode display as claimed in claim 3, wherein:
the semiconductor layer further comprises a protruding portion protruding in the first direction at the bent portion, and
the conductive layer overlaps the protruding portion of the semiconductor layer in plan view.

6. The organic light emitting diode display as claimed in claim 3, wherein:
the semiconductor layer further comprises a protruding portion protruding in the first direction and an upper direction at the bent portion, and
the conductive layer overlaps the protruding portion of the semiconductor layer in plan view.

7. The organic light emitting diode display as claimed in claim 3, wherein:
the semiconductor layer further comprises an island portion spaced apart from the semiconductor layer by a predetermined distance at the bent portion, and
the conductive layer overlaps the island portion of the semiconductor layer in plan view.

8. The organic light emitting diode display as claimed in claim 1, wherein the conductive layer is disposed between the substrate and the semiconductor layer in a cross-sectional view.

9. The organic light emitting diode display as claimed in claim 8, wherein the conductive layer is not connected to any elements.

10. The organic light emitting diode display as claimed in claim 8, wherein the conductive layer is connected to an element which has a voltage level of a driving voltage ELVDD.

11. The organic light emitting diode display as claimed in claim 10, further comprising:
a barrier layer above the substrate and below the conductive layer;
a buffer layer above the conductive layer and below the semiconductor layer;
a first gate insulating layer on the semiconductor layer;
a first gate conductor on the first gate insulating layer;
a second gate insulating layer covering the first gate conductor and the first gate insulating layer;
a second gate conductor on the second gate insulating layer;
an interlayer insulating layer covering the second gate conductor and the second gate insulating layer;
a data conductor on the interlayer insulating layer; and
a passivation layer covering the data conductor and the interlayer insulating layer,
wherein:
the data conductor includes a driving voltage line applying the driving voltage ELVDD,
the driving voltage line and the second gate conductor are electrically connected to each other through an opening in the interlayer insulating layer, and
the second gate conductor is electrically connected to the conductive layer through an opening in the buffer layer, the first gate insulating layer, and the second gate insulating layer.

12. The organic light emitting diode display as claimed in claim 11, wherein the second gate conductor is a parasitic capacitor control pattern.

13. The organic light emitting diode display as claimed in claim 11, wherein the second gate conductor is a connecting member.

14. The organic light emitting diode display as claimed in claim 1, further comprising:
a second conductive layer disposed higher than the semiconductor layer from the substrate, wherein
the conductive layer, the third node of the semiconductor layer, and the second conductive layer are sequentially overlapped in a cross-sectional view.

15. The organic light emitting diode display as claimed in claim 14, wherein the second conductive layer is connected to an element which has a voltage level of a driving voltage ELVDD.

16. The organic light emitting diode display as claimed in claim 14, wherein the conductive layer and the second conductive layer are in direct electrical contact with one another.

17. An organic light emitting diode display, comprising:
a substrate;
a semiconductor layer on the substrate, the semiconductor layer including a channel, a first electrode, and a second electrode for each a plurality of transistors; and
a conductive layer, wherein the plurality of transistors include:
- a first transistor having a gate electrode, an input electrode, and an output electrode;
- a second transistor that is connected to a scan line, a data line, and the input electrode of the first transistor; and
- a third transistor including a gate electrode connected to the scan line, a first electrode connected to the output electrode of the first transistor, and a second electrode connected to the gate electrode of the first transistor, the third transistor including two transistors connected at a third node in the semiconductor layer, wherein the conductive layer is disposed above the gate electrode of the first transistor, is disposed below the data line, and overlaps the third node of the semiconductor layer in plan view.

18. The organic light emitting diode display as claimed in claim 17, further comprising:
- a barrier layer above the substrate and below the conductive layer;
- a buffer layer above the conductive layer and below the semiconductor layer;
- a first gate insulating layer on the semiconductor layer;
- a first gate conductor on the first gate insulating layer;
- a second gate insulating layer covering the first gate conductor and the first gate insulating layer;
- a second gate conductor on the second gate insulating layer;
- an interlayer insulating layer covering the second gate conductor and the second gate insulating layer;
- a data conductor on the interlayer insulating layer; and
- a passivation layer covering the data conductor and the interlayer insulating layer, wherein:
the conductive layer is on the same layer as the second gate conductor.

19. The organic light emitting diode display as claimed in claim 18, wherein:
the data conductor includes a driving voltage line to apply the driving voltage ELVDD, and
the driving voltage line and the conductive layer are electrically connected to each other through an opening in the interlayer insulating layer.

20. The organic light emitting diode display as claimed in claim 19, wherein the conductive layer is extended to an adjacent pixel area.

21. The organic light emitting diode display as claimed in claim 18, further comprising:
a second conductive layer disposed higher than the semiconductor layer from the substrate, wherein
the second conductive layer, the conductive layer, and the third node of the semiconductor layer are sequentially overlapped in a cross-sectional view.

22. The organic light emitting diode display as claimed in claim 21, wherein the second conductive layer is connected to an element which has a voltage level of a driving voltage ELVDD.

23. The organic light emitting diode display as claimed in claim 21, wherein the conductive layer and the second conductive layer are in direct electrical contact with one another.

24. The organic light emitting diode display as claimed in claim 17, wherein the semiconductor layer extends in a first direction within the third transistor, is bent at a bent portion in a second direction, and then extends in the second direction.

25. The organic light emitting diode display as claimed in claim 24, wherein the third node is disposed at the bent portion of the semiconductor layer.

26. The organic light emitting diode display as claimed in claim 25, wherein the semiconductor layer further comprises a protruding portion protruding in an upper direction at the bent portion, and
the conductive layer overlaps the protruding portion of the semiconductor layer in plan view.

27. The organic light emitting diode display as claimed in claim 25, wherein the semiconductor layer further comprises a protruding portion protruding in the first direction at the bent portion, and
the conductive layer overlaps the protruding portion of the semiconductor layer in plan view.

28. The organic light emitting diode display as claimed in claim 25, wherein the semiconductor layer further comprises a protruding portion protruding in the first direction and an upper direction at the bent portion, and
the conductive layer overlaps the protruding portion of the semiconductor layer in plan view.

29. The organic light emitting diode display as claimed in claim 25, wherein:
the semiconductor layer further comprises an island portion spaced apart from the semiconductor layer by a predetermined distance at the bent portion, and
the conductive layer overlaps the island portion of the semiconductor layer in plan view.

* * * * *